(12) United States Patent
Bhattacharyya et al.

(10) Patent No.: US 10,451,978 B2
(45) Date of Patent: Oct. 22, 2019

(54) METROLOGY PARAMETER DETERMINATION AND METROLOGY RECIPE SELECTION

(71) Applicant: ASML NETHERLANDS B.V., Veldhoven (NL)

(72) Inventors: Kaustuve Bhattacharyya, Veldhoven (NL); Simon Gijsbert Josephus Mathijssen, Rosmalen (NL); Marc Johannes Noot, Eindhoven (NL); Arie Jeffrey Den Boef, Waalre (NL); Mohammadreza Hajiahmadi, Rotterdam (NL); Farzad Farhadzadeh, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/010,320

(22) Filed: Jun. 15, 2018

(65) Prior Publication Data

US 2019/0004437 A1    Jan. 3, 2019

(30) Foreign Application Priority Data

Jun. 30, 2017   (EP) .................................... 17178949

(51) Int. Cl.
| | | |
|---|---|---|
| *G03B 27/42* | (2006.01) | |
| *G03F 7/20* | (2006.01) | |
| *G01B 11/27* | (2006.01) | |

(52) U.S. Cl.
CPC ........ *G03F 7/70625* (2013.01); *G01B 11/272* (2013.01); *G03F 7/70058* (2013.01); *G03F 7/70633* (2013.01); *G01B 2210/56* (2013.01)

(58) Field of Classification Search
CPC ........ G01B 11/26; G01B 11/272; G01B 5/24; G03F 7/70633; G03F 1/42; G03F 1/84;
(Continued)

(56) References Cited

U.S. PATENT DOCUMENTS

| | | |
|---|---|---|
| 2006/0066855 A1 | 3/2006 | Boef et al. |
| 2011/0027704 A1 | 2/2011 | Cramer et al. |
| | (Continued) | |

FOREIGN PATENT DOCUMENTS

| | | |
|---|---|---|
| WO | 2009078708 A1 | 6/2009 |
| WO | 2009106279 A1 | 9/2009 |
| | (Continued) | |

OTHER PUBLICATIONS

Search Report dated Dec. 14, 2017 issued in corresponding European Patent Application No. EP 17178949.

(Continued)

*Primary Examiner* — Mesfin T Asfaw
(74) *Attorney, Agent, or Firm* — Pillsbury Winthrop Shaw Pittman LLP

(57) ABSTRACT

A method including: for a metrology target, having a first biased target structure and a second differently biased target structure, created using a patterning process, obtaining metrology data including signal data for the first target structure versus signal data for the second target structure, the metrology data being obtained for a plurality of different metrology recipes and each metrology recipe specifying a different parameter of measurement; determining a statistic, fitted curve or fitted function through the metrology data for the plurality of different metrology recipes as a reference; and identifying at least two different metrology recipes that have a variation of the collective metrology data of the at least two different metrology recipes from a parameter of the reference that crosses or meets a certain threshold.

25 Claims, 23 Drawing Sheets

(58) Field of Classification Search
CPC ...... G03F 7/70683; G03F 7/20; G03F 9/7015; H01L 2223/54426
See application file for complete search history.

(56) References Cited

U.S. PATENT DOCUMENTS

| | | |
|---|---|---|
| 2011/0043791 A1 | 2/2011 | Smilde et al. |
| 2011/0069292 A1 | 3/2011 | Den Boef |
| 2012/0013881 A1 | 1/2012 | Den Boef et al. |
| 2012/0242940 A1 | 9/2012 | Nagata et al. |
| 2013/0155406 A1 | 6/2013 | Den Boef |
| 2016/0161864 A1 | 6/2016 | Middlebrooks et al. |

FOREIGN PATENT DOCUMENTS

| | | |
|---|---|---|
| WO | 2011012624 A1 | 2/2011 |
| WO | 2015013625 A1 | 2/2015 |

OTHER PUBLICATIONS

Daniel Kandel et al., "Overlay accuracy fundamentals", Metrology, Inspection, and Process Control for Microlithography XXVI, Proc. of SPIE, vol. 8324, Mar. 9, 2012, pp. 832417-1-832417-10.
International Search Report and Written Opinion of the International Searching Authority dated Sep. 26, 2018 issued in corresponding International Application No. PCT/EP2018/066117.
Taiwanese Office Action issued in corresponding Taiwanese Patent Application No. 107122433, dated Mar. 15, 2019.

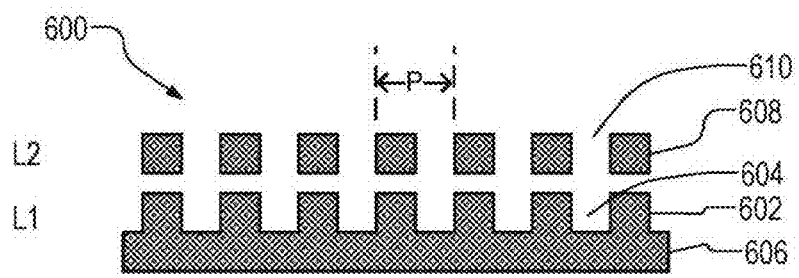
Fig. 11A
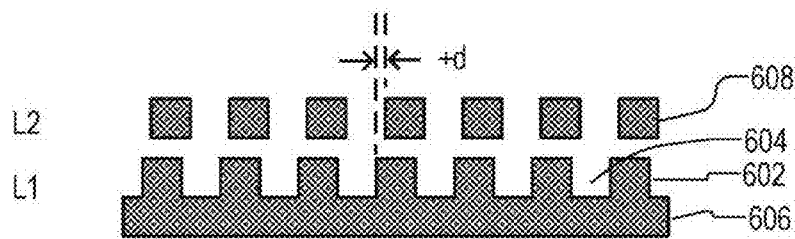
Fig. 11B
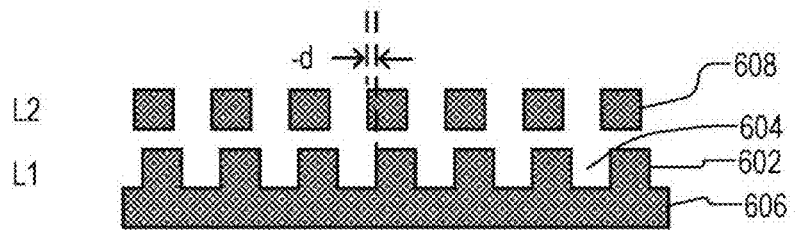
Fig. 11C
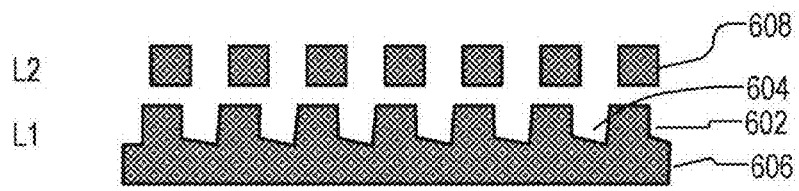
Fig. 11D
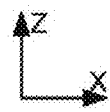

METROLOGY PARAMETER DETERMINATION AND METROLOGY RECIPE SELECTION

This application claims the benefit of priority of European patent application no. EP17178949, filed Jun. 30, 2017. The content of the foregoing application is incorporated herein in its entirety by reference.

FIELD

The present disclosure relates to methods and apparatus for inspection (e.g., metrology) usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Significant aspects to enabling a patterning process (i.e., a process of creating a device or other structure involving patterning (such as lithographic exposure or imprint), which may typically include one or more associated processing steps such as development of resist, etching, etc.) include developing the process itself, setting it up for monitoring and control and then actually monitoring and controlling the process itself. Assuming a configuration of the fundamentals of the patterning process, such as the patterning device pattern(s), the resist type(s), post-lithography process steps (such as the development, etch, etc.), it is desirable to setup the apparatus in the patterning process for transferring the pattern onto the substrates, develop one or more metrology targets to monitor the process, setup up a metrology process to measure the metrology targets and then implement a process of monitoring and/or controlling the process based on measurements.

So, in a patterning process, it is desirable to determine (e.g., measure, simulate using one or more models that model one or more aspects of the patterning process, etc.) one or more parameters of interest, such as the critical dimension (CD) of a structure, the overlay error between successive layers (i.e., the undesired and unintentional misalignment of successive layers) formed in or on the substrate, etc.

It is desirable to determine such one or more parameters of interest for structures created by a patterning process and use them for design, control and/or monitoring relating to the patterning process, e.g., for process design, control and/or verification. The determined one or more parameters of interest of patterned structures can be used for pattering process design, correction and/or verification, defect detection or classification, yield estimation and/or process control.

Thus, in patterning processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Various forms of inspection apparatus (e.g., metrology apparatus) have been developed for use in the lithographic field. These devices direct a beam of radiation onto a target and measure one or more properties of the redirected (e.g., scattered) radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

A further technique is involves having the zeroth order of diffraction (corresponding to a specular reflection) blocked, and only higher orders are processed. Examples of such metrology can be found in PCT patent application publication nos. WO 2009/078708 and WO 2009/106279, which are hereby incorporated by reference in their entirety. Further developments of the technique have been described in U.S. patent application publication nos. US 2011-0027704, US 2011-0043791 and US 2012-0242940, each of which is incorporated herein in its entirety. Such diffraction-based techniques are typically used to measure overlay. The targets for techniques can be smaller than the illumination spot and may be surrounded by product structures on a substrate. A target can comprise multiple periodic structures, which can be measured in one image. In a particular form of such a metrology technique, overlay measurement results are obtained by measuring a target twice under certain conditions, while either rotating the target or changing the illumination mode or imaging mode to obtain separately a normal (e.g., $+1^{st}$) and a complementary (e.g., $-1^{st}$) diffraction order intensities. The intensity asymmetry, a comparison of these diffraction order intensities, for a given target provides a measurement of target asymmetry, that is asymmetry in the target. This asymmetry in the target can be used as an indicator of overlay error.

SUMMARY

In the example of overlay measurement, the techniques above rely on an assumption that overlay (i.e., overlay error and deliberate bias) is the only cause of target asymmetry in the target. Any other asymmetry in the target or the measurement, such as structural asymmetry of features within the periodic structure in an upper and/or lower layer, an asymmetry in the measurement using the sensor, etc., can also cause a measured intensity asymmetry in the $1^{st}$ (or other higher) orders. This intensity asymmetry attributable to such other asymmetry in the target and/or measurement, and which is not related to overlay (including an intentional bias), perturbs the overlay measurement, giving an inaccurate overlay measurement.

In an embodiment, there is provided a method comprising: for a metrology target, having a first biased target structure and a second differently biased target structure, created using a patterning process, obtaining metrology data comprising signal data for the first target structure versus signal data for the second target structure, the metrology data being obtained for a plurality of different metrology recipes and each metrology recipe specifying a different parameter of measurement; determining a statistic, fitted curve or fitted function through the metrology data for the plurality of different metrology recipes as a reference; and identifying at least two different metrology recipes that have a variation of the collective metrology data of the at least two different metrology recipes from a parameter of the reference that crosses or meets a certain threshold.

In an embodiment, there is provided a method comprises: obtaining, for a metrology target, overlay values per pixel of a detector of an inspection apparatus used to measure the metrology target and/or of an image produced by a detector of an inspection apparatus used to measure the metrology target using a plurality of different metrology recipes, the metrology target created using a patterning process and each metrology recipe specifying a different parameter of measurement; determining a statistic of the overlay values for each of the plurality of different metrology recipes; and identifying at least two different metrology recipes that have a value of the statistic that crosses or meets a certain threshold.

In an embodiment, there is provided a measurement method comprising measuring a metrology target on a substrate according to a metrology recipe as determined herein.

In an embodiment, there is provided a metrology apparatus for measuring a parameter of a patterning process, the metrology apparatus being operable to perform a method as described herein.

In an embodiment, there is provided a non-transitory computer program product comprising machine-readable instructions for causing a processor to cause performance of a method as described herein.

In an embodiment, there is provided a system comprising: an inspection apparatus configured to provide a beam of radiation on two adjacent periodic structures or measurement targets on a substrate and to detect radiation diffracted by the targets to determine a parameter of a patterning process; and a non-transitory computer program as described herein. In an embodiment, the system further comprises a lithographic apparatus comprising a support structure configured to hold a patterning device to modulate a radiation beam and a projection optical system arranged to project the modulated radiation beam onto a radiation-sensitive substrate.

Further features and advantages, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example only, with reference to the accompanying drawings in which:

FIG. 11A, FIG. 11B and FIG. 11C respectively show schematic cross-sections of overlay periodic structures having different overlay values in the region of zero;

FIG. 11D is a schematic cross-section of an overlay periodic structure having structural asymmetry in a bottom periodic structure due to processing effects;

DETAILED DESCRIPTION

Before describing embodiments in detail, it is instructive to present an example environment in which embodiments may be implemented.

Figure 1:
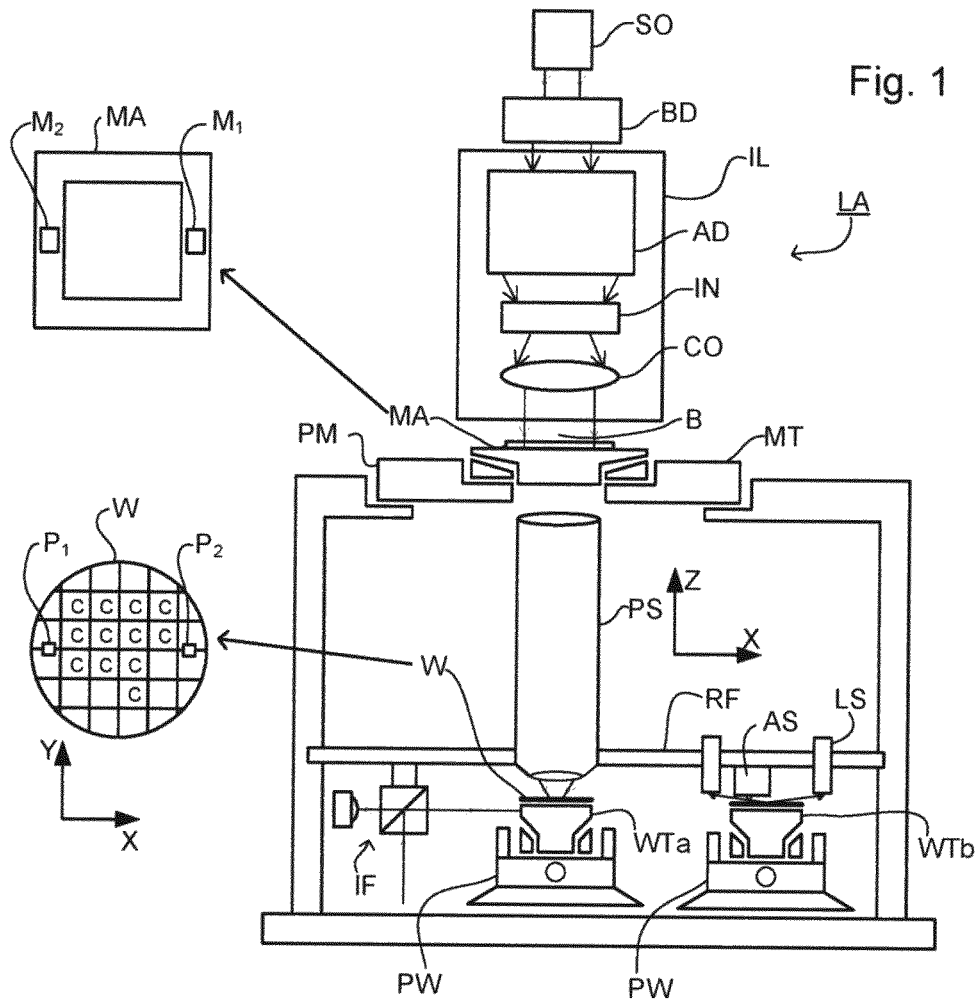
FIG. 1 depicts an embodiment of a lithographic apparatus.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using patterning device alignment marks $M_1, M_2$ and substrate alignment marks $P_1, P_2$. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the embodiments of the present invention.

Figure 2:
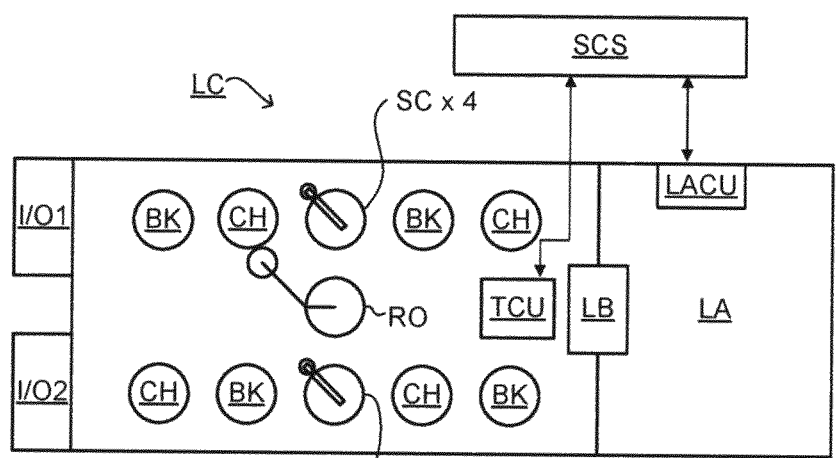
FIG. 2 depicts an embodiment of a lithographic cell or cluster.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order to design, monitor, control, etc. the patterning process (e.g., a device manufacturing process) that includes at least one patterning step (e.g., an optical lithography step), the patterned substrate can be inspected and one or more parameters of the patterned substrate are measured. The one or more parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on a substrate. There are various techniques for making measurements of the structures formed in the patterning process, including the use of a scanning electron microscope, image-based measurement or inspection tools and/or various specialized tools. A relatively fast and non-invasive form of specialized metrology and/or inspection tool is one in which a beam of radiation is directed onto a target on the surface of the substrate and properties of the scattered (diffracted/reflected) beam are measured. By comparing one or more properties of the beam before and after it has been scattered by the substrate, one or more properties of the substrate can be determined. This may be termed diffraction-based metrology or inspection.

Figure 3:
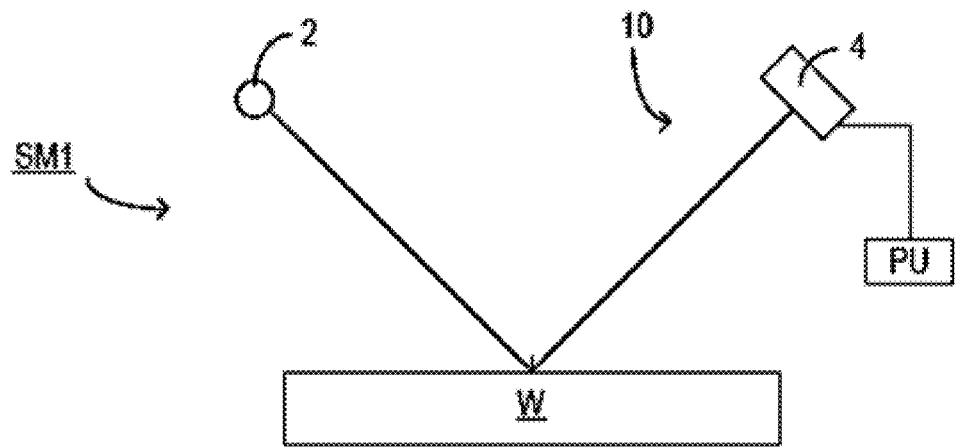
FIG. 3 schematically depicts an example inspection apparatus and metrology technique.
Figure 3:
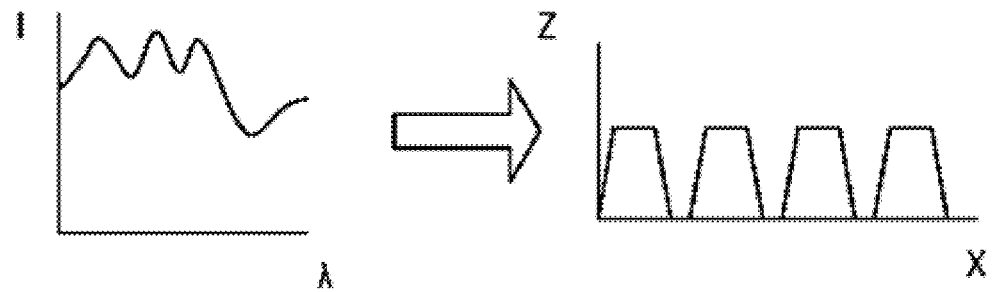

FIG. 3 depicts an example inspection apparatus (e.g., a scatterometer). It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 3. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Figure 4:
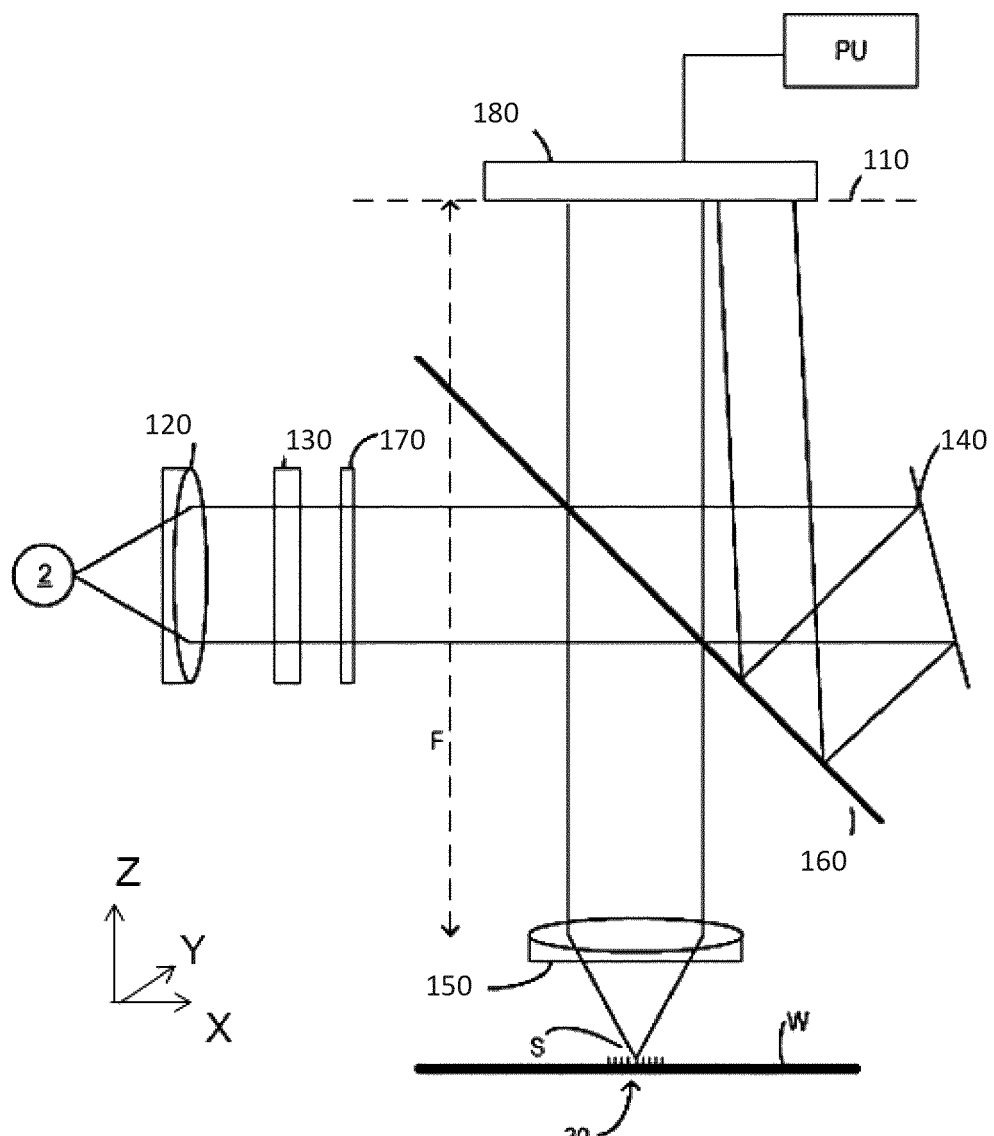
FIG. 4 schematically depicts an example inspection apparatus.

Another inspection apparatus that may be used is shown in FIG. 4. In this device, the radiation emitted by radiation source 2 is collimated using lens system 120 and transmitted through interference filter 130 and polarizer 170, reflected by partially reflecting surface 160 and is focused into a spot S on substrate W via an objective lens 150, which has a high numerical aperture (NA), desirably at least 0.9 or at least 0.95. An immersion inspection apparatus (using a relatively high refractive index fluid such as water) may even have a numerical aperture over 1.

As in the lithographic apparatus LA, one or more substrate tables may be provided to hold the substrate W during measurement operations. The substrate tables may be similar or identical in form to the substrate table WT of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided for example to acquire the position of a target of interest, and to bring it into position under the objective lens 150. Typically many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation redirected by the substrate W then passes through partially reflecting surface 160 into a detector 180 in order to have the spectrum detected. The detector 180 may be located at a back-projected focal plane 110 (i.e., at the focal length of the lens system 150) or the plane 110 may be re-imaged with auxiliary optics (not shown) onto the detector 180. The detector may be a two-dimensional detector so that a two-dimensional angular scatter spectrum of a substrate target 30 can be measured. The detector 180 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 160 part of it is transmitted through the partially reflecting surface 160 as a reference beam towards a reference mirror 140. The reference beam is then projected onto a different part of the same detector 180 or alternatively on to a different detector (not shown).

One or more interference filters 130 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 180 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to change in processing in the patterning process (e.g., optical aberration in the lithographic projection apparatus (particularly the projection system PS), focus change, dose change, etc.) and will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, diffraction-based metrology or inspection can be used in the measurement of asymmetry of features in product and/or resist patterns. A particular application of asymmetry measurement is for the measurement of overlay, for example, but other applications are also known. In this case, the target 30 typically comprises one set of periodic features superimposed on another. For example, asymmetry can be measured by comparing opposite parts of the diffraction spectrum from the target 30 (for example, comparing the $-1^{st}$ and $+1^{st}$ orders in the diffraction spectrum of a periodic structure). The concepts of asymmetry measurement using the instrument of FIG. 3 or FIG. 4 are described, for example, in U.S. patent application publication US2006-066855, which is incorporated herein in its entirety by reference. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 4, where detector 180 may be an image sensor, such asymmetry in the diffraction orders appears directly as asymmetry in the pupil image recorded by detector 180. This asymmetry can be measured by digital image processing in unit PU, and calibrated against known values of overlay.

Figure 5:
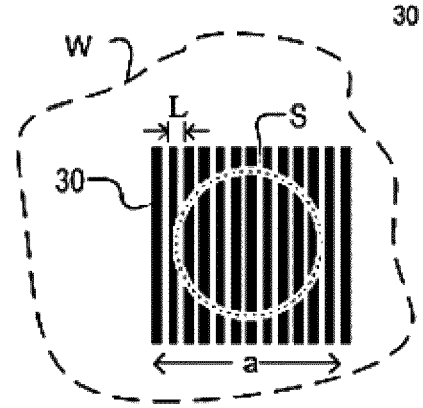
FIG. 5 illustrates the relationship between an illumination spot of an inspection apparatus and a metrology target.

FIG. 5 illustrates a plan view of a typical target 30, and the extent of illumination spot S in the apparatus of FIG. 4. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 120, 130, 170 may be configured to provide illumination of a uniform intensity across a back focal plane of objective 150. Alternatively, by, e.g., including an aperture in the illumination path, illumination may be restricted to on axis or off axis directions.

Figure 6:
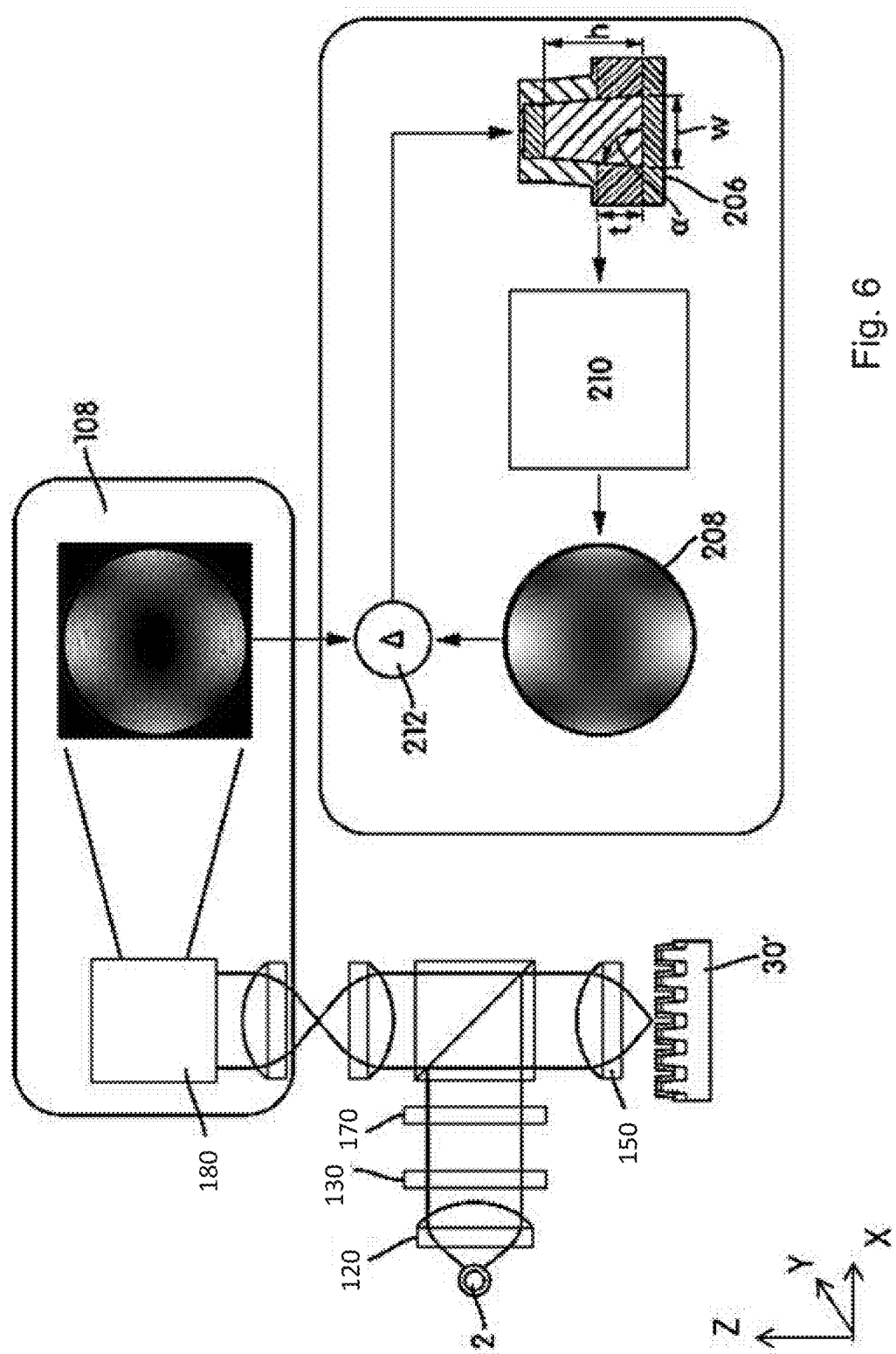
FIG. 6 schematically depicts a process of deriving a plurality of variables of interest based on measurement data.

FIG. 6 schematically depicts an example process of the determination of the value of one or more variables of interest of a target pattern 30' based on measurement data obtained using metrology. Radiation detected by the detector 180 provides a measured radiation distribution 108 for target 30'.

For a given target 30', a radiation distribution 208 can be computed/simulated from a parameterized model 206 using, for example, a numerical Maxwell solver 210. The parameterized model 206 shows example layers of various materials making up, and associated with, the target. The parameterized model 206 may include one or more of variables for the features and layers of the portion of the target under consideration, which may be varied and derived. As shown in FIG. 6, the one or more of the variables may include the thickness t of one or more layers, a width w (e.g., CD) of one or more features, a height h of one or more features, and/or a sidewall angle α of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. The initial values of the variables may be those expected for the target being measured. The measured radiation distribution 108 is then compared at 212 to the computed radiation distribution 208 to determine the difference between the two. If there is a difference, the values of one or more of the variables of the parameterized model 206 may be varied, a new computed radiation distribution 208 calculated and compared against the measured radiation distribution 108 until there is sufficient match between the measured radiation distribution 108 and the computed radiation distribution 208. At that point, the values of the variables of the parameterized model 206 provide a good or best match of the geometry of the actual target 30'. In an embodiment, there is sufficient match when a difference between the measured radiation distribution 108 and the computed radiation distribution 208 is within a tolerance threshold.

Figure 7A:
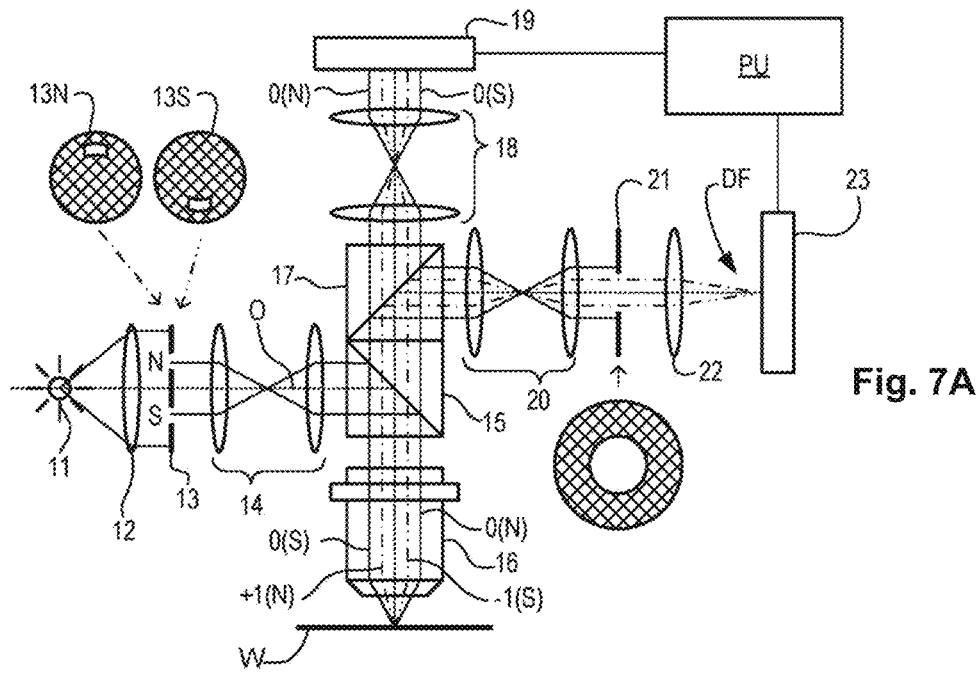
FIG. 7A depicts a schematic diagram of an inspection apparatus (e.g., a dark field scatterometer in this case) configured to measure a target using a first pair of illumination apertures.

A further inspection apparatus suitable for use in embodiments is shown in FIG. 7A. A target T and diffracted rays of measurement radiation used to illuminate the target are illustrated in more detail in FIG. 7B. The inspection apparatus illustrated is of a type known as a dark field metrology apparatus. The inspection apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by source 11 (e.g., a xenon lamp) is directed onto substrate W via optical element 15 by an optical system comprising lenses 12, 14 and objective lens 16. These lenses are arranged in a double sequence of a 4F arrangement. A different lens arrangement can be used, provided that it, e.g., provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis radiation from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode will interfere with the desired measurement signals.

Figures 7B, 7C, 7D:
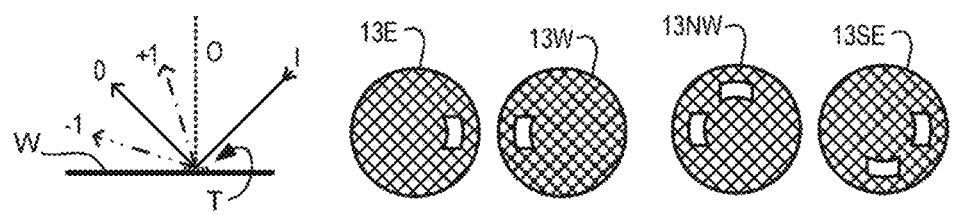
FIG. 7B schematically depicts a detail of a diffraction spectrum of a target periodic structure for a given direction of illumination.
FIG. 7C schematically depicts a second pair of illumination apertures providing further illumination modes in using the inspection apparatus of FIG. 7A for diffraction based overlay measurements.
FIG. 7D schematically depicts a third pair of illumination apertures combining the first and second pair of apertures.

As shown in FIG. 7B, target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitches of the targets and the illumination angles can be designed or adjusted so that the first order rays entering the objective lens are closely aligned with the central optical axis. The rays illustrated in FIGS. 7A and 7B are shown somewhat off axis, purely to enable them to be more easily distinguished in the diagram.

At least the 0 and $+1^{st}$ orders diffracted by the target T on substrate W are collected by objective lens 16 and directed back through optical element 15. Returning to FIG. 7A, both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the inspection apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the periodic structure features as such will not be formed, if only one of the $-1^{st}$ and $+1^{st}$ orders is present.

The particular forms of aperture plate 13 and field stop 21 shown in FIGS. 7A, 7C and 7D are purely examples. In an embodiment, on-axis illumination of the targets is used and an aperture stop with an off-axis aperture is used to pass substantially only one first order of diffracted radiation to the sensor. In yet other embodiments, 2nd, 3rd and higher order beams (not shown in FIG. 7A, 7B, 7C or 7D) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure periodic structures oriented in one direction (X or Y depending on the set-up). For measurement of an orthogonal periodic structure, rotation of the target through 90° and 270° might be implemented. Different aperture plates are shown in FIGS. 7C and 7D. The use of these, and numerous other variations and applications of the apparatus are described in the patent application publications mentioned above.

Figure 8:
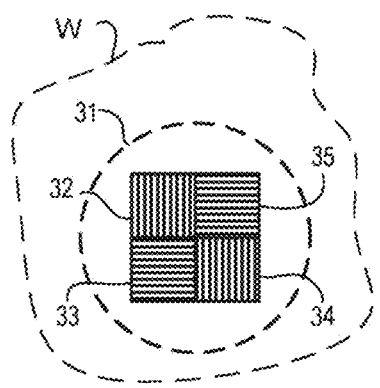
FIG. 8 depicts a form of multiple periodic structure target and an outline of a measurement spot on a substrate.

FIG. 8 depicts a (composite) target formed on a substrate according to known practice. The target in this example comprises four periodic structures (e.g., gratings) 32 to 35 positioned closely together so that they will all be within a measurement spot 31 formed by the metrology radiation illumination beam of the inspection apparatus. The four periodic structures thus are all simultaneously illuminated and simultaneously imaged on sensors 19 and 23. In an example dedicated to measurement of overlay, periodic structures 32 to 35 are themselves composite periodic structures formed by overlying periodic structures that are patterned in different layers of, e.g., the semi-conductor device formed on substrate W. Periodic structures 32 to 35 may have differently biased overlay offsets in order to facilitate measurement of overlay between the layers in which the different parts of the composite periodic structures are formed. The meaning of overlay bias will be explained below with reference to FIG. 8. Periodic structures 32 to 35 may also differ in their orientation, as shown, so as to diffract incoming radiation in X and Y directions. In one example, periodic structures 32 and 34 are X-direction periodic structures with bias offsets of +d, −d, respectively. Periodic structures 33 and 35 are Y-direction periodic structures with bias offsets +d, −d respectively. Separate images of these periodic structures can be identified in the image captured by sensor 23. This is only one example of a target. A target may comprise more or fewer than 4 periodic structures, or only a single periodic structure.

Figure 9:
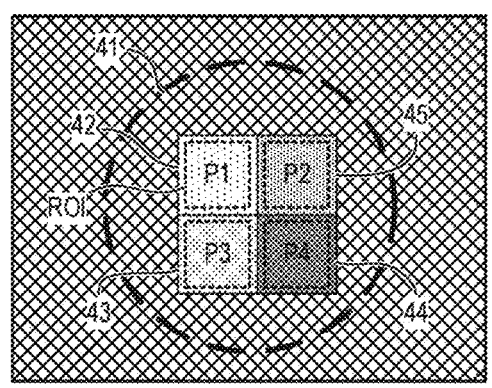
FIG. 9 depicts an image of the target of FIG. 8 obtained in the inspection apparatus of FIG. 7A.

FIG. 9 shows an example of an image that may be formed on and detected by the sensor 23, using the target of FIG. 8 in the apparatus of FIG. 7, using the aperture plates 13NW or 13SE from FIG. 7D. While the pupil plane image sensor 19 cannot resolve the different individual periodic structures 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target periodic structures 32 to 35. If the targets are located in product areas, product features may also be visible in the periphery of this image field. Image processor and control system PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the patterning process. Overlay performance is an important example of such a parameter.

Figure 10:
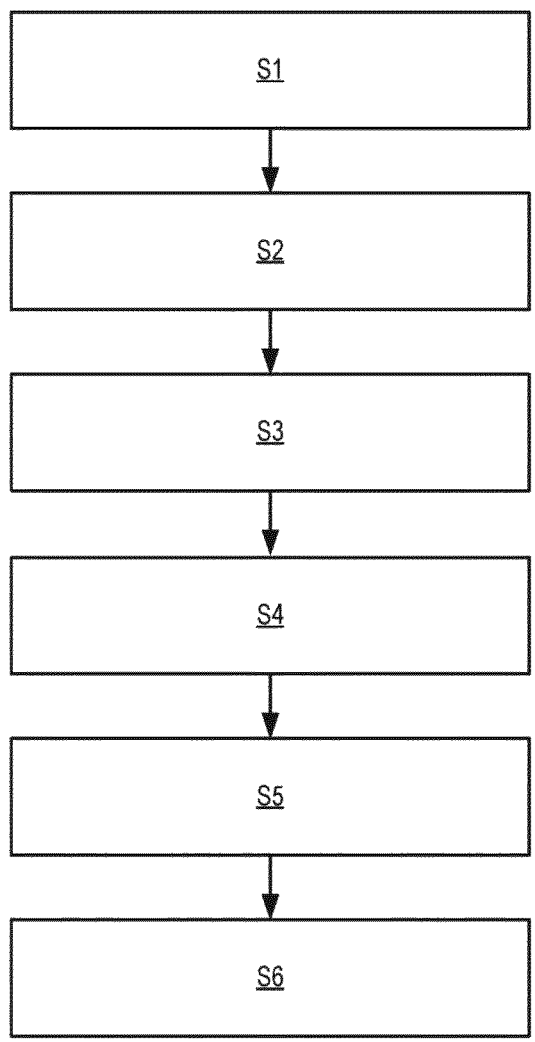
FIG. 10 is a flowchart showing steps of an overlay measurement method using the inspection apparatus of FIG. 3.

FIG. 10 illustrates how, using for example the method described in PCT patent application publication no. WO 2011/012624 (incorporated herein in its entirety by reference), overlay error (i.e., undesired and unintentional overlay misalignment) between the two layers containing the component periodic structures 32 to 35 is measured. This measurement is done through identifying target asymmetry, as revealed by comparing the intensities in the normal and complementary diffraction order images of the target periodic structures to obtain a measure of the intensity asymmetry. In an embodiment, the normal diffraction order is $+1^{st}$ order radiation and the complementary diffraction order is $-1^{st}$ order radiation. While the discussion herein focuses the normal diffraction order as being $+1^{st}$ order radiation and the complementary diffraction order being $-1^{st}$ order radiation, the intensities of other corresponding higher orders can be compared, e.g. $+2^{nd}$ and $-2^{nd}$ orders.

At step S1, the substrate, for example a semiconductor wafer, is processed through a lithographic apparatus, such as the lithographic cell of FIG. 2, one or more times, to create a target including the periodic structures 32-35. At S2, using the inspection apparatus of FIG. 7, an image of the periodic structures 32 to 35 is obtained using only one of the first order diffracted beams (say +1 order). At step S3, whether by changing the illumination mode, or changing the imaging mode, or by rotating substrate W by 180° in the field of view of the inspection apparatus, a second image of the periodic structures using the other first order diffracted beam (−1 order) can be obtained. Consequently the −1 order diffracted radiation is captured in the second image.

Note that, by including only half of the first order diffracted radiation in each image, the 'images' referred to here are not conventional dark field microscopy images. The individual target features of the target periodic structures will not be resolved. Each target periodic structure will be represented simply by an area of a certain intensity level. In step S4, a region of interest (ROI) is identified within the image of each component target periodic structure, from which intensity levels will be measured.

Having identified the ROI for each individual target periodic structure and measured its intensity, the asymmetry of the target, and hence overlay error, can then be determined. This is done (e.g., by the processor PU) in step S5 comparing the intensity values obtained for the normal and complementary diffraction order radiation for each target periodic structure 32-35 to identify their intensity asymmetry, e.g., any difference in their intensity. The term "difference" is not intended to refer only to subtraction. Differences may be calculated in ratio form. In step S6 the measured intensity asymmetries for a number of target periodic structures are used, together with knowledge of any known imposed overlay biases of those target periodic structures, to calculate one or more performance parameters of the patterning process in the vicinity of the target T.

FIGS. 11A-11D show schematic cross sections of target periodic structures (overlay periodic structures), with different bias offsets. These can be used as the target T on substrate W, as seen in FIGS. 7-9. Periodic structures with periodicity in the X direction are shown for the sake of example only. Different combinations of these periodic structures with different biases and with different orientations can be provided separately or as part of a target.

Starting with FIG. 11A, a target 600 formed in at least two layers, labeled L1 and L2, is shown. In the lower or bottom layer L1, a first periodic structure (the lower or bottom periodic structure), for example a grating, is formed by features 602 and spaces 604 on a substrate 606. In layer L2, a second periodic structure, for example a grating, is formed by features 608 and spaces 610. (The cross-section is drawn such that the features 602, 608 (e.g., lines) extend into the page.) The periodic structure pattern repeats with a pitch P in both layers. Features 602 and 608 may take the form of lines, dots, blocks and via holes. In the situation shown at FIG. 11A, there is no overlay contribution due to misalignment, e.g., no overlay error and no imposed bias, so that each feature 608 of the second structure lies exactly over a feature 602 in the first structure.

At FIG. 11B, the same target with a first known imposed bias +d is shown, such that the features 608 of the first structure are shifted by a distance d to the right, relative to the features of the second structure. The bias distance d might be a few nanometers in practice, for example 10 nm-20 nm, while the pitch P is for example in the range 300-1000 nm, for example 500 nm or 600 nm. At FIG. 11C, another feature with a second known imposed bias −d, such that the features of 608 are shifted to the left, is depicted. The value of d need not be the same for each structure. Biased periodic structures of this type shown at FIGS. 11A to 11C are described in the prior patent application publications mentioned above.

Figure 11E:
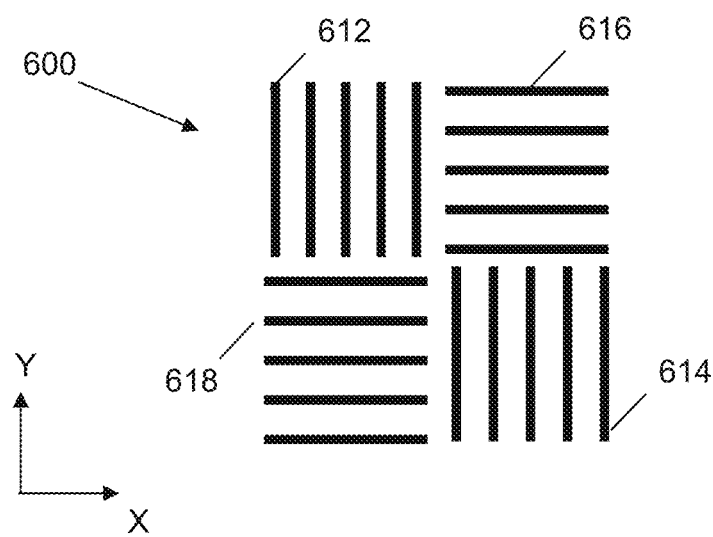
FIG. 11E is a schematic top view of an overlay target having periodic structures with intentional bias.

FIG. 11E schematically depicts, from the top, an example target 600 having sub-targets 612, 614, 616 and 618 comprising periodic structures in upper and lower layers such as depicted in FIGS. 11A to 11C. The lower layer is not shown in FIG. 11E. In an embodiment, the sub-targets 612, 614, 616 and 618 are designed to measure overlay in two perpendicular directions (e.g., X and Y) and have an imposed bias d to facilitate that (as described above in respect of FIGS. 11B and 11C). While the embodiment of FIG. 11E shows four sub-targets, there can be a different number and they can all be used to measure overlay in 1 direction or to measurement overlay in more than 2 directions.

In an embodiment, sub-targets 612 and 614 are designed to together measure overlay in the X-direction. In an embodiment, sub-target 612 has a bias of +d, while sub-target 614 has a bias of −d. In an embodiment, sub-targets 616 and 618 are designed to together measure overlay in the Y-direction. In an embodiment, sub-target 616 has a bias of +d, while sub-target 618 has a bias of −d.

Figure 11F:
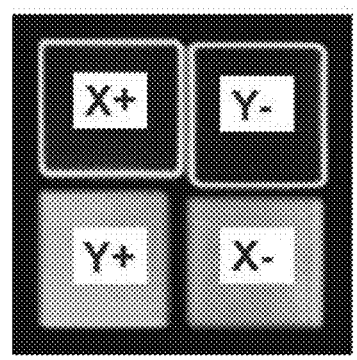
FIG. 11F depicts an example of a detected diffraction signal of a particular order radiation from a target such as depicted in FIG. 11E.
Figure 11G:
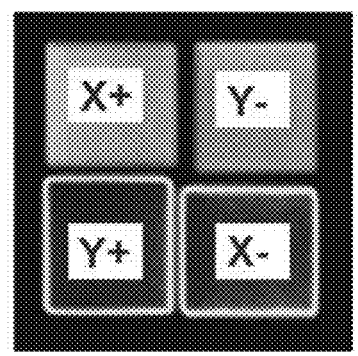
FIG. 11G depicts an example of a detected diffraction signal of another particular order radiation from a target such as depicted in FIG. 11E.

FIG. 11F depicts an example of a detected diffraction signal of the normal (e.g., +1$^{st}$) order radiation from step S2 of a target 600 such as depicted in FIG. 11E. FIG. 11G depicts an example of a detected diffraction signal of the complementary (e.g., −1$^{st}$) order radiation from step S3 of a target 600 such as depicted in FIG. 11E. For each periodic structure direction (X and Y) there are two periodic structures with opposite directions of intentional bias shown in FIGS. 11F and 11G by "+" (for +d bias) and "−" (for −d bias). So, X+ represents a detected diffraction signal from sub-target 612, X− represents a detected diffraction signal from sub-target 614, Y+ represents a detected diffraction signal from sub-target 618 and Y− represents a detected diffraction signal from sub-target 616. Thus, four diffraction intensity signals are detected per each periodic structure periodicity direction.

Figure 11H:
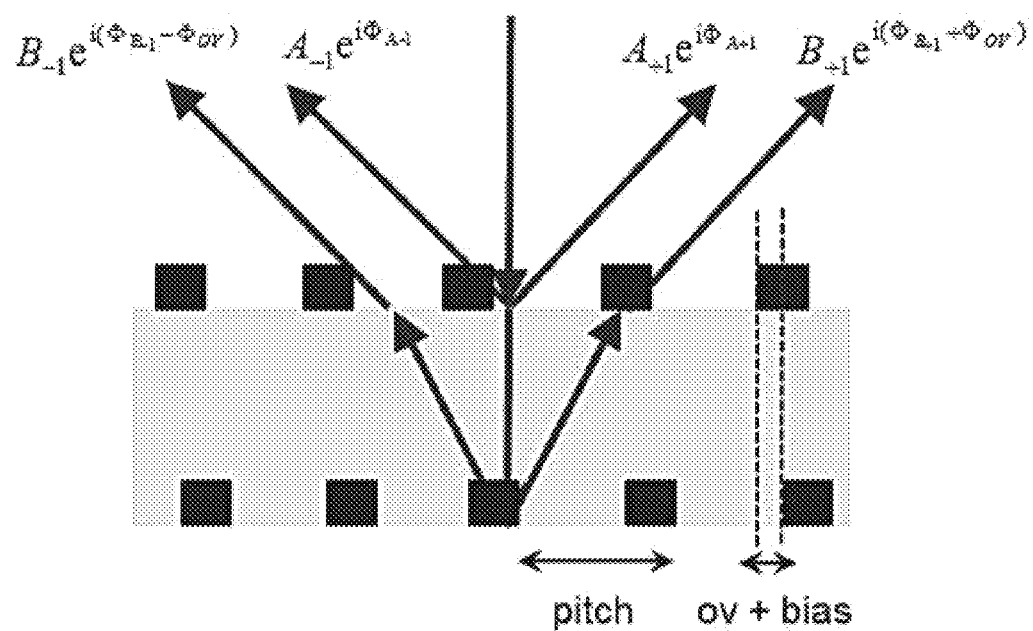
FIG. 11H is schematic depiction of a simple model for describing diffraction of radiation from a target with a two-layer periodic structure.

FIG. 11H is schematic depiction of a simple model for describing diffraction of radiation from a target (such as a sub-target 612, 614, 616 or 618) with a two-layer periodic structure (such as shown in FIGS. 11A to 11C). The complex amplitude of diffracted radiation from the upper layer and lower layer are shown. Diffracted radiation from the lower layer includes a phase contribution from overlay.

Figure 12:
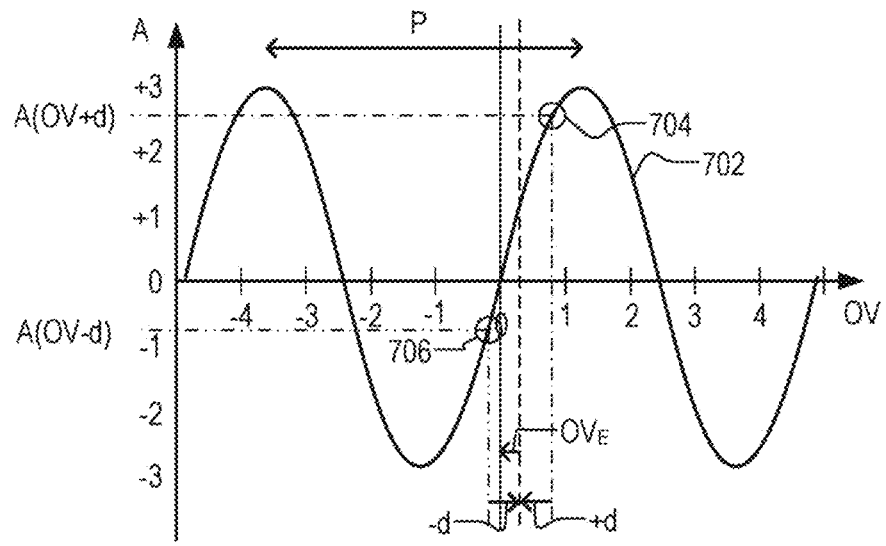
FIG. 12 illustrates principles of overlay measurement in an ideal target, not subject to structural asymmetry.
Figure 13:
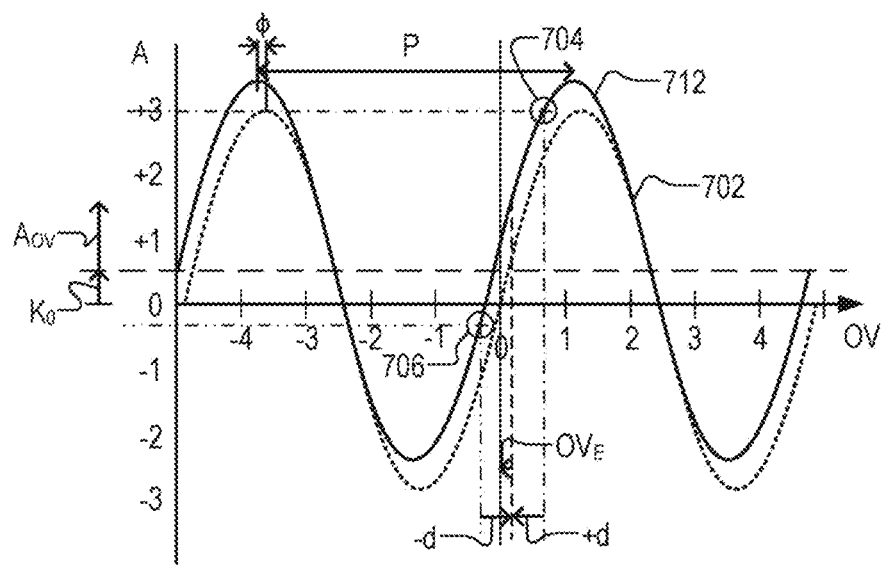
FIG. 13 illustrates principles of overlay measurement in a non-ideal target, with correction of structural asymmetry as disclosed in embodiments herein.

In FIG. 12 a curve 702 illustrates the relationship between overlay OV and intensity asymmetry A (e.g., the difference between the intensity of the +1$^{st}$ and −1$^{st}$ diffraction order intensity) for an 'ideal' target having zero offset and no structural asymmetry within the individual periodic structures forming the target, and in particular within the individual periodic structure of the first structure. Consequently, the target asymmetry of this ideal target comprises only an overlay contribution due to misalignment of the first structure and second structure resultant from a known imposed bias and overlay error $OV_E$. This graph, and the graph of FIG. 13, illustrate the principles behind the disclosure only, and in each graph, the units of intensity asymmetry A and overlay OV are arbitrary. Examples of actual dimensions will be given further below.

In the 'ideal' situation of FIG. 12, the curve 702 indicates that the intensity asymmetry A has a non-linear periodic relationship (e.g., sinusoidal relationship) with the overlay. The period P of the sinusoidal variation corresponds to the period or pitch P of the periodic structures, converted of course to an appropriate scale. The sinusoidal form is pure in this example, but can include harmonics in real circumstances.

As mentioned above, biased periodic structures (having a known imposed overlay bias) can be used to measure overlay, rather than relying on a single measurement. This bias has a known value defined in the patterning device (e.g. a reticle) from which it was made, that serves as an on-substrate calibration of the overlay corresponding to the measured intensity asymmetry. In the drawing, the calculation is illustrated graphically. In steps S1-S5, intensity asymmetry measurements $A+_d$ and $A-_d$ are obtained for periodic structures having imposed biases +d and −d respectively (as shown in FIG. 11B and FIG. 11C, for example). Fitting these measurements to the sinusoidal curve gives points 704 and 706 as shown. Knowing the biases, the true overlay error $OV_E$ can be calculated. The pitch P of the sinusoidal curve is known from the design of the target. The vertical scale of the curve 702 is not known to start with, but is an unknown factor which can be referred to as a 1$^{st}$ harmonic proportionality constant, K. Thus, overlay sensitivity K is a measure of the sensitivity of the intensity asymmetry measurements to overlay. In an embodiment, it is a proportionality of the measured intensity with respect to overlay. It thus helps detect process dependency of overlay.

In equation terms, the relationship between overlay error $OV_E$ and intensity asymmetry A is assumed to be:

$$A_{\pm d} = K \sin(OV_E \pm d) \quad (1)$$

where overlay error $OV_E$ is expressed on a scale such that the target pitch P corresponds to an angle $2\pi$ radians. Using two measurements of periodic structures with different, known biases (e.g. +d and −d), the overlay error $OV_E$ can be calculated using:

$$OV_E = \operatorname{atan}\left(\frac{A_{+d} + A_{-d}}{A_{+d} - A_{-d}} \cdot \tan(d)\right) \quad (2)$$

Referring back to FIG. 11H, the overlay OV (also referred to overlay error $OV_E$) can also be evaluated as follows. Specifically, based on the model represented in FIG. 11H, the intensities of the $+1^{st}$ and $-1^{st}$ order of diffracted radiation can be calculated as follows:

$$I_{+1} = |A_{+1}e^{j\Phi_{A+1}} + B_{+1}e^{i(\Phi_{B+1}+\Phi_{OV})}|^2 = \quad (3)$$
$$A_{+1}^2 + B_{+1}^2 + 2A_{+1}B_{+1} \times \cos[\Phi_{A_{+1}} - \Phi_{B_{+1}} - \Phi_{OV}]$$
$$I_{-1} = |A_{-1}e^{j\Phi_{A-1}} + B_{-1}e^{i(\Phi_{B-1}-\Phi_{OV})}|^2 =$$
$$A_{-1}^2 + B_{-1}^2 + 2A_{-1}B_{-1} \times \cos[\Phi_{A_{-1}} - \Phi_{B_{-1}} - \Phi_{OV}]$$

where $\Phi_{OV} = \frac{2\pi}{P}(OV \pm d)$ is the phase difference due to overlay and bias and $$\Phi_A - \Phi_B = \beta \propto 4\pi\frac{T}{\lambda}$$

is the rest of the phase difference between diffracted radiation from upper and lower layers, which is proportional to the thickness T of the layer between the upper and lower periodic structures and inversely proportional to the wavelength of the incident radiation.

For convenience, the four intensities of one periodic structure direction (e.g. X) can be designated as follows:
- PBN ($+1^{st}$ diffraction order from positive bias periodic structure)
- PBC ($-1^{st}$ diffraction order from positive bias periodic structure)
- NBN ($+1^{st}$ diffraction order from negative bias periodic structure)
- NBC ($-1^{st}$ diffraction order from negative bias periodic structure)

So, $\Delta I_{PB}$ can be designated as PBN-PBC and $\Delta I_{NB}$ can be designated as NBN-NBC. Then, with the assumption that the amplitude and phase (excluding overlay phase) of diffracted waves from the $+1^{st}$ and $-1^{st}$ order radiation and also from positive bias and negative bias periodic structures are equal, and the optics of the metrology device is symmetric itself, a difference between intensity of $+1^{st}$ and $-1^{st}$ order radiation is derived as $\Delta I = K \cdot \sin(\Phi_{OV})$, with K being overlay proportionality equal to $K = 4 \, A \cdot B \cdot \sin(\beta)$. Hence, the overlay can be calculated as follows:

$$OV = \frac{P}{2\pi}\tan^{-1}\left(\tan\left(\frac{2\pi d}{P}\right) \cdot \frac{\Delta I_{PB} + \Delta I_{NB}}{\Delta I_{PB} - \Delta I_{NB}}\right) \quad (4)$$

Now, FIG. 11D shows schematically a phenomenon of structural asymmetry, in this case structural asymmetry in the first structure (lower or bottom structure asymmetry). The features in the periodic structures at FIGS. 11A to 11C, are shown as perfectly square-sided, when a real feature would have some slope on the side, and a certain roughness. Nevertheless they are intended to be at least symmetrical in profile. The features 602 and/or spaces 604 at FIG. 11D in the first structure no longer have a symmetrical form at all, but rather have become distorted by one or more processing steps. Thus, for example, a bottom surface of each space has become tilted (bottom wall tilt). For example, side wall angles of the features and spaces have become asymmetrical. As a result of this, the overall target asymmetry of a target will comprise an overlay contribution independent of structural asymmetry (i.e., an overlay contribution due to misalignment of the first structure and second structure; itself comprised of overlay error and any known imposed bias) and a structural contribution due to this structural asymmetry in the target.

When overlay is measured by the method of FIG. 10 using only two biased periodic structures, the process-induced structural asymmetry cannot be distinguished from the overlay contribution due to misalignment, and overlay measurements (in particular to measure the undesired overlay error) become unreliable as a result. Structural asymmetry in the first structure (bottom periodic structure) of a target is a common form of structural asymmetry. It may originate, for example, in the substrate processing steps such as chemical-mechanical polishing (CMP), performed after the first structure was originally formed.

FIG. 13 shows a first effect of introducing structural asymmetry, for example the bottom periodic structure asymmetry illustrated in FIG. 11D. The 'ideal' sinusoidal curve 702 no longer applies. However, at least approximately, bottom periodic structure asymmetry or other structural asymmetry has the effect of adding an intensity shift term $K_0$ and a phase shift term $\phi$ to the intensity asymmetry $A_{\pm d}$. The resulting curve is shown as 712 in the diagram, with label $K_0$ indicating the intensity shift term, and label $\phi$ indicating the phase offset term. The intensity shift term $K_0$ and phase shift term $\phi$ are dependent upon a combination of the target and a selected characteristic of the measurement radiation, such as the wavelength and/or polarization of the measurement radiation, and is sensitive to process variations. In equation terms, the relationship used for calculation in step S6 becomes:

$$A_{\pm d} = K_0 + K \sin(OV_E \pm d + \phi) \quad (5)$$

Where there is structural asymmetry, the overlay model described by equation (2) will provide overlay error values which are impacted by the intensity shift term $K_0$ and phase shift term $\phi$, and will be inaccurate as a consequence. The structural asymmetry will also result in differences in measurements of the same target using one or more different measurement parameters (e.g., wavelength of the measurement beam, polarization of the measurement beam, etc.), when mapping the overlay error, because intensity and phase shift are, e.g., wavelength and/or polarization dependent.

The overlay calculations of modified step S6 rely on certain assumptions. Firstly, it is assumed intensity asymmetry behaves as a sine function of the overlay, with the period P corresponding to the periodic structure pitch. These assumptions are valid for present overlay ranges. The number of harmonics can be designed to be small, because the small pitch-wavelength ratio only allows for a small number of propagating diffraction orders from the periodic structure. However, in practice the overlay contribution to the intensity asymmetry due to misalignment may not necessarily be truly sinusoidal, and may not necessarily be completely symmetrical about OV=0.

So, the effect of structural asymmetry can be generally formulated as:

$$\Delta I_+ = K(OV+d) + \Delta I_{BG} \quad (6)$$

$$\Delta I_- = K(OV-d) + \Delta I_{BG} \quad (7)$$

where ΔI− (also synonymous with A−) and ΔI+ (also synonymous with A+) represent the intensity asymmetry measured for the negatively biased and positively biased periodic structures respectively and $\Delta I_{BG}$ is the contribution to the intensity asymmetry of the structural asymmetry. And so, the overlay error ΔOV can be considered as a function of $\Delta I_{BG}/K$.

Now, it has been further discovered that, in addition to or alternatively to structural asymmetry in a target, a stack difference between adjacent periodic structures of a target or between adjacent targets may be a factor that adversely affects the accuracy of measurement, such as overlay measurement. Stack difference may be understood as an un-designed difference in physical configurations between adjacent periodic structures or targets. Stack difference causes a difference in an optical property (e.g., intensity, polarization, etc.) of measurement radiation between the adjacent periodic structures or targets that is due to other than overlay error, other than intentional bias and other than structural asymmetry common to the adjacent periodic structures or targets. Stack difference includes, but is not limited to, a thickness difference between the adjacent periodic structures or targets (e.g., a difference in thickness of one or more layers such that one periodic structure or target is higher or lower than another periodic structure or target designed to be at a substantially equal level), a refractive index difference between the adjacent periodic structures or targets (e.g., a difference in refractive index of one or more layers such that the combined refractive index for the one or more layers for one periodic structure or target is different than the combined refractive index for the one or more layers for of another periodic structure or target even though designed to have a substantially equal combined refractive index), a difference in material between the adjacent periodic structures or targets (e.g., a difference in the material type, material uniformity, etc. of one or more layers such that there is a difference in material for one periodic structure or target from another periodic structure or target designed to have a substantially same material), a difference in the periodic structure period of the structures of adjacent periodic structures or targets (e.g., a difference in the periodic structure period for one periodic structure or target from another periodic structure or target designed to have a substantially same periodic structure period), a difference in depth of the structures of adjacent periodic structures or targets (e.g., a difference due to etching in the depth of structures of one periodic structure or target from another periodic structure or target designed to have a substantially same depth), a difference in width (CD) of the features of adjacent periodic structures or targets (e.g., a difference in the width of features of one periodic structure or target from another periodic structure or target designed to have a substantially same width of features), etc. In some examples, the stack difference is introduced by processing steps, such as CMP, layer deposition, etching, etc. in the patterning process. In an embodiment, periodic structures or targets are adjacent if within 200 μm of each other, within 150 μm of each other, within 100 μm of each other, within 75 μm of each other, within 50 μm of each other, within 40 μm of each other, within 30 μm of each other, within 20 μm of each other, or within 10 μm of each other.

The effect of stack difference (which can be referred to as grating imbalance between gratings) can be generally formulated as:

$$\Delta I_+ = (K+\Delta K)(OV+d) \quad (8)$$

$$\Delta I_- = (K-\Delta K)(OV-d) \quad (9)$$

wherein ΔK represents a difference in the overlay sensitivity attributable to the stack difference. And so, the overlay error ΔOV can be proportional to $$\frac{\Delta K}{K}d.$$

So, in order to characterize the stack difference, one or more stack difference parameters can be defined. As noted above, a stack difference parameter is a measure of the un-designed different physical configuration of the adjacent periodic structures or targets. In an embodiment, the stack difference parameter can be determined from evaluating cross-sections of the adjacent periodic structures or targets.

In an embodiment, the stack difference parameter can be determined for lower adjacent periodic structures of a composite periodic structure by evaluating the lower adjacent periodic structures before the upper periodic structures are applied. In an embodiment, the stack difference parameter can be derived from a reconstruction of the adjacent periodic structures or targets from optical measurements of the adjacent periodic structures or targets or from cross-sections of the adjacent periodic structures or targets. That is, the physical dimensions, characteristics, materials properties, etc. are reconstructed and the differences between the adjacent periodic structures or targets are determined to arrive at a stack difference parameter.

An embodiment of the stack difference parameter is a periodic structure intensity imbalance (GI) which can be defined as:

$$GI = 2 * \frac{\hat{I}^{+d} - \hat{I}^{-d}}{\hat{I}^{+d} + \hat{I}^{-d}} \quad (10)$$

where $\hat{I}^{+d}$ is the average of the $+1^{st}$ diffraction order intensity signal diffracted by a first periodic structure having a +d bias, $I_{+1}^{+d}$, and $-1^{st}$ diffraction order intensity signal diffracted by the first periodic structure having the +d bias, $I_{-1}^{+d}$. Similarly, $\hat{I}^{-d}$ is the average of the $+1^{st}$ diffraction order intensity signal diffracted by a second periodic structure having a −d bias, $I_{+1}^{-d}$, and $-1^{st}$ diffraction order intensity signal diffracted by the second periodic structure having the −d bias, $I_{-1}^{-d}$. In an embodiment, the periodic structure intensity imbalance (GI) can be a derived version, such as $$\frac{\hat{I}^{+d} - \hat{I}^{-d}}{\hat{I}^{+d} + \hat{I}^{-d}}, \frac{\hat{I}^{+d} + \hat{I}^{-d}}{\hat{I}^{+d} - \hat{I}^{-d}},$$

etc.

Further, the measurement accuracy and/or sensitivity of a target may vary with respect to one or more attributes of the target itself and/or one or more attributes of the measurement radiation provided onto the target, for example, the wavelength of the radiation, the polarization of the radiation, and/or the intensity distribution (i.e., angular or spatial intensity distribution) of the radiation. In an embodiment, the wavelength range of the radiation is limited to one or more wavelengths selected from a range (e.g., selected from the range of about 400 nm to 900 nm). Further, a selection of different polarizations of the radiation beam (e.g., TE polarized radiation and TM polarized radiation) may be provided and various illumination shapes can be provided using, for example, a plurality of different apertures.

So, to enable such selection and measurement, a metrology recipe can be used that specifies one or more parameters of the measurement using the measurement system. In an embodiment, the term "metrology recipe" includes one or more parameters of the measurement itself, one or more parameters of a pattern of the target measured, or both.

In this context, a pattern of the target measured (also referred to as a "target" or "target structure") may be a pattern that is optically measured, e.g., whose diffraction is measured. The target pattern measured may be a pattern specially designed or selected for measurement purposes. Multiple copies of a target may be placed on many places on a substrate.

In an embodiment, if the metrology recipe comprises one or more parameters of the measurement itself, the one or more parameters of the measurement itself can include one or more parameters relating to a measurement beam and/or measurement apparatus used to make the measurement. For example, if the measurement used in a metrology recipe is a diffraction-based optical measurement, one or more parameters of the measurement itself may include a wavelength of measurement radiation, and/or a polarization of measurement radiation, and/or measurement radiation intensity distribution, and/or an illumination angle (e.g., incident angle, azimuth angle, etc.) relative to the substrate of measurement radiation, and/or the relative orientation relative to a pattern on the substrate of diffracted measurement radiation, and/or a number of measured points or instances of the target, and/or the locations of instances of the target measured on the substrate. The one or more parameters of the measurement itself may include one or more parameters of the metrology apparatus used in the measurement, which can include detector sensitivity, numerical aperture, etc.

In an embodiment, if the metrology recipe comprises one or more parameters of a pattern measured, the one or more parameters of the pattern measured may include one or more geometric characteristics (such as a shape of at least part of the pattern, and/or orientation of at least part of the pattern, and/or a pitch of at least part of the pattern (e.g., pitch of a periodic structure including the pitch of an upper periodic structure in a layer above that of a lower periodic structure and/or the pitch of the lower periodic structure), and/or a size (e.g., CD) of at least part of the pattern (e.g., the CD of a feature of a periodic structure, including that of a feature of the upper periodic structure and/or the lower periodic structure), and/or a segmentation of a feature of the pattern (e.g., a division of a feature of a periodic structure into sub-structures), and/or a length of a periodic structure or of a feature of the periodic structure), and/or a materials property (e.g., refractive index, extinction coefficient, material type, etc.) of at least part of the pattern, and/or an identification of the pattern (e.g., distinguishing a pattern being from another pattern), etc.

A metrology recipe may be expressed in a form like ($r_1$, $r_2$, $r_3$, . . . $r_n$; $t_1$, $t_2$, $t_3$, . . . $t_m$), where $r_i$ are one or more parameters of the measurement and $t_j$ are one or more parameters of one or more patterns measured. As will be appreciated, n and m can be 1. Further, the metrology recipe does not need to have both one or more parameters of the measurement and one or more parameters of one or more patterns measured; it can have just one or more parameters of the measurement or have just one or more parameters of one or more patterns measured.

A target may be subjected to measurement using two metrology recipes A and B, e.g., differ on the stage at which a target is measured (e.g., A measures a target when it comprises a latent image structure and B measures a target when it doesn't comprise a latent image structure) and/or differ on the parameters of their measurement. Metrology recipes A and B can at least differ on the target measured (e.g., A measures a first target and B measures a second different target). Metrology recipes A and B may differ on the parameters of their measurement and target measurement. Metrology recipes A and B may not even be based on the same measurement technique. For example recipe A may be based on diffraction-based measurement and recipe B may be based on scanning electron microscope (SEM) or atomic force microscopy (AFM) measurement.

Now, as noted above, some techniques of determining overlay assume that a measured intensity asymmetry is proportional only to the actual overlay shift between periodic structure layers. However, this is not necessarily the case as the measured asymmetry is also affected by various feature asymmetry effects that occur in production of the periodic structures of the target, such as structural asymmetry, stack difference, etc. These feature asymmetry effects perturb the first order asymmetry-based overlay measurement and can result in a bias of the measurement, and therefore an inaccurate overlay measurement.

A technique to analyze overlay that aims to account for feature asymmetry effects such as structural asymmetry, stack difference, etc. involves a self-reference technique using A+ versus A− analysis described in PCT patent application publication no. WO 2015/018625 and U.S. patent application publication no. US 2016/0161864, which are incorporated herein in their entireties by reference.

In an embodiment, this involves an A+ versus A− analysis which comprises analyzing diffraction-based overlay measurements by determining the asymmetry A+ of the radiation (e.g., a difference between the positive $1^{st}$ order radiation and the negative $1^{st}$ order radiation) from a positively biased periodic structure (e.g., periodic structure 612) as a function of the asymmetry A− of the radiation (e.g., a difference between the positive $1^{st}$ order radiation and the negative $1^{st}$ order radiation) from a negatively biased periodic structure (e.g., periodic structure 614). In an embodiment, A+ and A− are determined for a number of different measured pupil pixels and/or a number of different wavelength-polarization combinations (i.e. for a number of different metrology recipes). From this data, a fit of a curve (e.g., a straight line) or a function (e.g., a function representing a curve, in particular a function representing a straight line) through the data is obtained. In an embodiment, the fitting is obtained by regression. In an embodiment, the fitting is obtained by linear regression. In an embodiment, from the curve or function, a measure of overlay can be determined (e.g., from the slope of a straight line or of an associated function for the straight line). The description herein will focus on curves (e.g., lines), but as will be appreciated additionally or alternatively a function (such as a function representing a curve such as a straight line) can be fitted through the data. The description herein will also focus on plots of A+ versus A−, but as will be appreciated plots of A+ versus A− data are not necessary to determine a fitted curve or function through the data.

Figure 14:
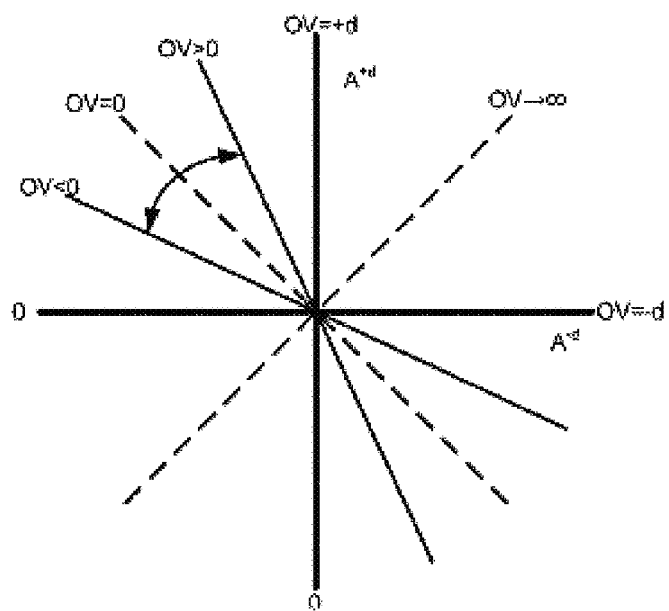
FIG. 14 is a plot of A+ versus A− for an overlay target that has no feature asymmetry effects according to an embodiment.

FIG. 14 is an example plot of A+(marked as A+$^d$) against A− (marked as A−$^d$) for overlay periodic structures that have no feature asymmetry effect, such that the only asymmetry present in the radiation is the asymmetry due to the bias and overlay, to show an example of the fitting. In this case, the relation between A+ and A− lies on a curve, specifically a straight line, fitting through the origin (because no feature asymmetry effect is assumed). The corresponding A+ versus A− data points for all the metrology recipes lay on this line. The slope of this line (which is the fitting) is related to the actual overlay. FIG. 14 shows six example lines that occur depending on the nature of the data. The dotted line labelled OV=0 is a line indicating zero overlay and has a slope of −1. This line would occur where the overlay is zero. The dotted line labelled $OV_\infty$ is a line having a slope of +1 and is indicative of overlay approaching infinity. So, when there is an overlay error in the data, there would be, e.g., a solid line labelled OV<0, which is a line having a slope less than −1 and is indicative of overlay less than zero, or a solid line labelled OV>0, which is a line having a slope greater than −1 and is indicative of overlay greater than zero. Additionally, it can be seen that overlay equal to +d, where d is the periodic structure bias, would result in a plotted line along the y-axis; and overlay equal to −d would result in a plotted line along the x-axis.

Figure 15:
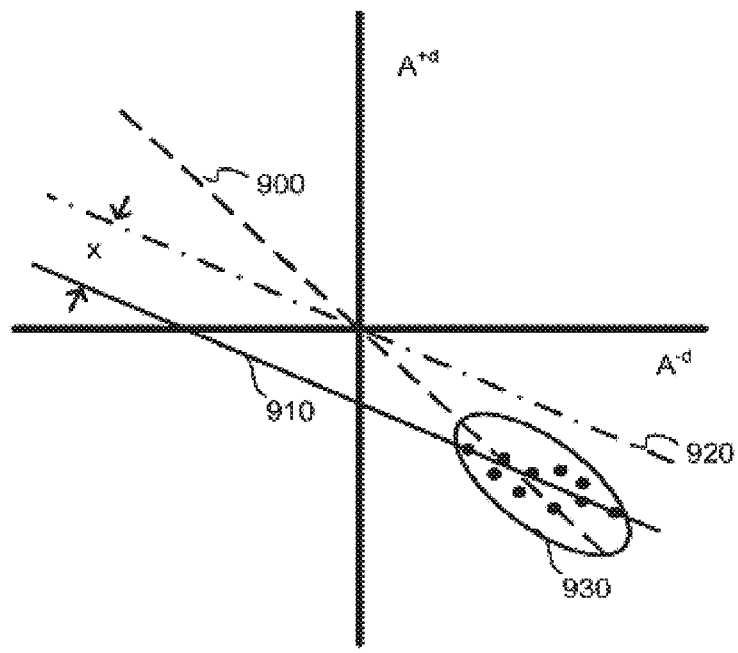
FIG. 15 is a plot of A+ against A− for an overlay target having a feature asymmetry effect according to an embodiment.

FIG. 15 is a plot of A+ against A− according to the techniques described above wherein the overlay target has a feature asymmetry effect. According to the techniques discussed above, wherein the overlay target has no feature asymmetry effect, the data points 930 would be fitted with a line 900 through the origin. However, in this embodiment, the data points are fitted according to a best fit method (for example, least squares) by a line 910 not necessarily going through the origin. In this way the overlay can still be calculated from the slope of the line 910; but it can be seen that line 910 is parallel to a line 920 indicative of that which would be seen for the same measured structure having no feature asymmetry effect. The axis intercept of line 910, that is the offset of line 910 from line 920 (a line having the same slope as line 910, but plotted through the origin), indicates quantitatively the effect of the feature asymmetry effect.

So, fitting of a curve or function through A+ versus A− data by, e.g., regression can yield a more accurate value of overlay as it would be without a contribution attributable to feature asymmetry effects, by determination of the slope of a fitted line through the data set, the line not necessarily being fitted through the origin. Optionally, feature asymmetry effects could be determined via an offset of the fitted line from the origin (e.g., an intercept term).

Figure 16A:
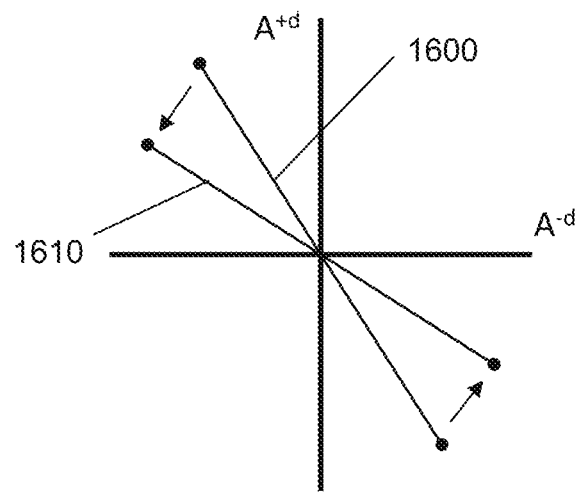
FIGS. 16A, 16B and 16C are plots of A+ against A− for an overlay target having various feature asymmetry effects (including no feature asymmetry effect) according to an embodiment.
Figure 16B:
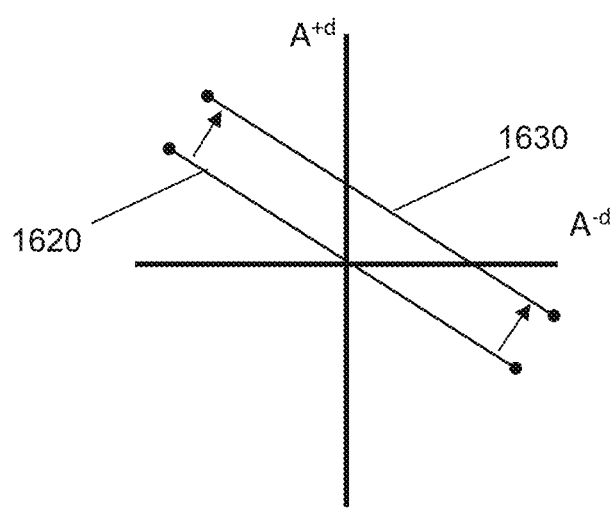
Figure 16C:
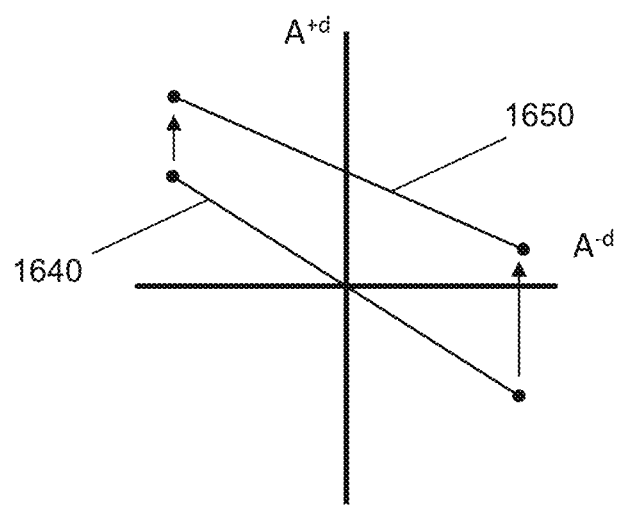

FIG. 16A-C are plots of A+ against A− demonstrating how the data shifts for various scenarios of feature asymmetry effect (including lack thereof). FIG. 16A is a plot of A+ against A− for an overlay target that has no feature asymmetry effect (e.g., no structural asymmetry and no stack difference). Line 1600 represents the data for the overlay target with a certain overlay and line 1610 represents the data for the overlay target with a different overlay. As discussed above, the slopes of the lines correspond to a magnitude of the overlay. So, the arrows show how the data, and thus the lines, are rotated depending on the magnitude of the overlay.

FIG. 16B is a plot of A+ against A− showing how the data is affected by, e.g., a structural asymmetry of an overlay target. Line 1620 represents the data for an overlay target with no feature asymmetry effect (and having a certain overlay). As discussed above, the line 1620 runs through the origin where there is no feature asymmetry effect. Now, line 1630 represents the data for the overlay target with a structural asymmetry (e.g., a bottom grating structural asymmetry) but having the same overlay. The structural asymmetry causes the data, and thus the line, to displace while retaining the same slope. So, the arrows show how the data, and thus the line 1630, is displaced depending on the magnitude of the structural asymmetry.

FIG. 16C is a plot of A+ against A− showing how the data is affected by, e.g., a stack difference of an overlay target. Line 1640 represents the data for an overlay target with no feature asymmetry effect (and having a certain overlay). As discussed above, the line 1640 runs through the origin where there is no feature asymmetry effect. Now, line 1650 represents the data for the overlay target with a stack difference but having the same overlay. The stack difference causes the data, and thus the line, to displace with different amounts. So, the arrows show how the data, and thus the line 1650, is displaced depending on the magnitude of the stack difference. Significantly, it can be seen the slope of the line is affected.

Figure 17A:
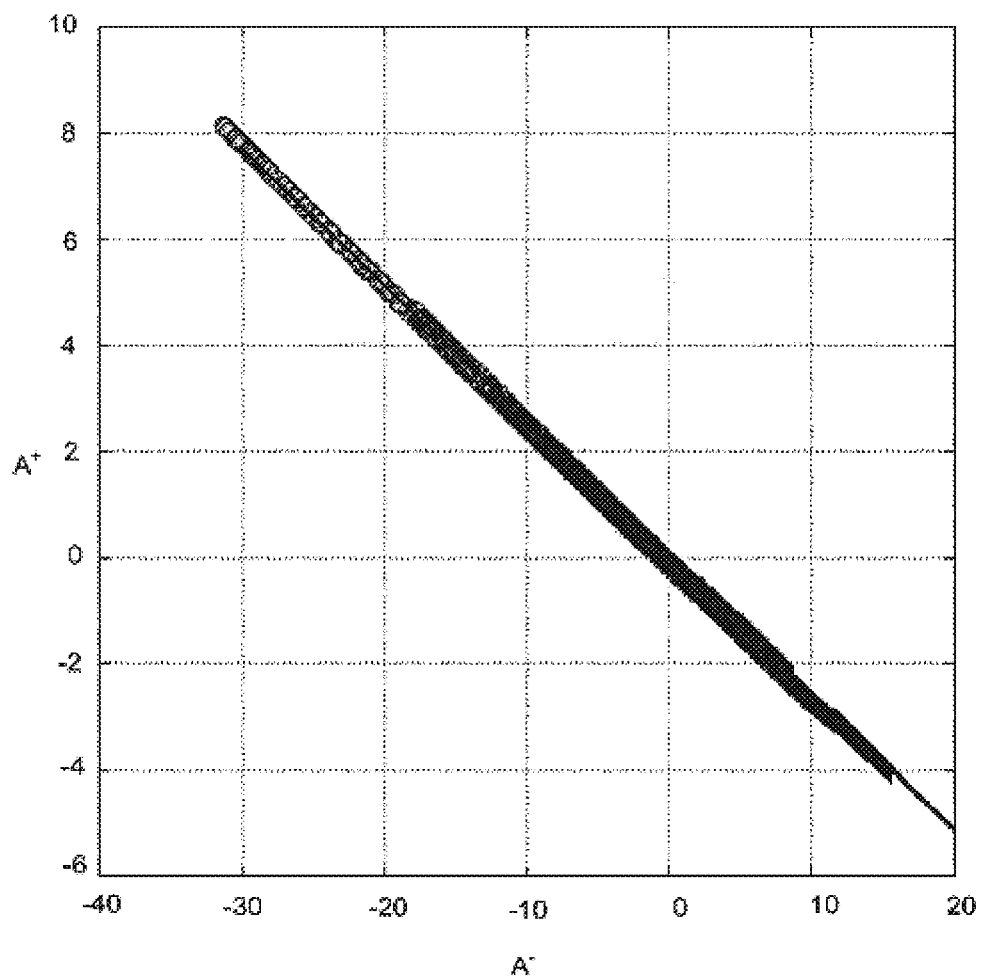
FIG. 17A is a plot of A+ against A− for an overlay target having no feature asymmetry effects according to an embodiment.
Figure 17B:
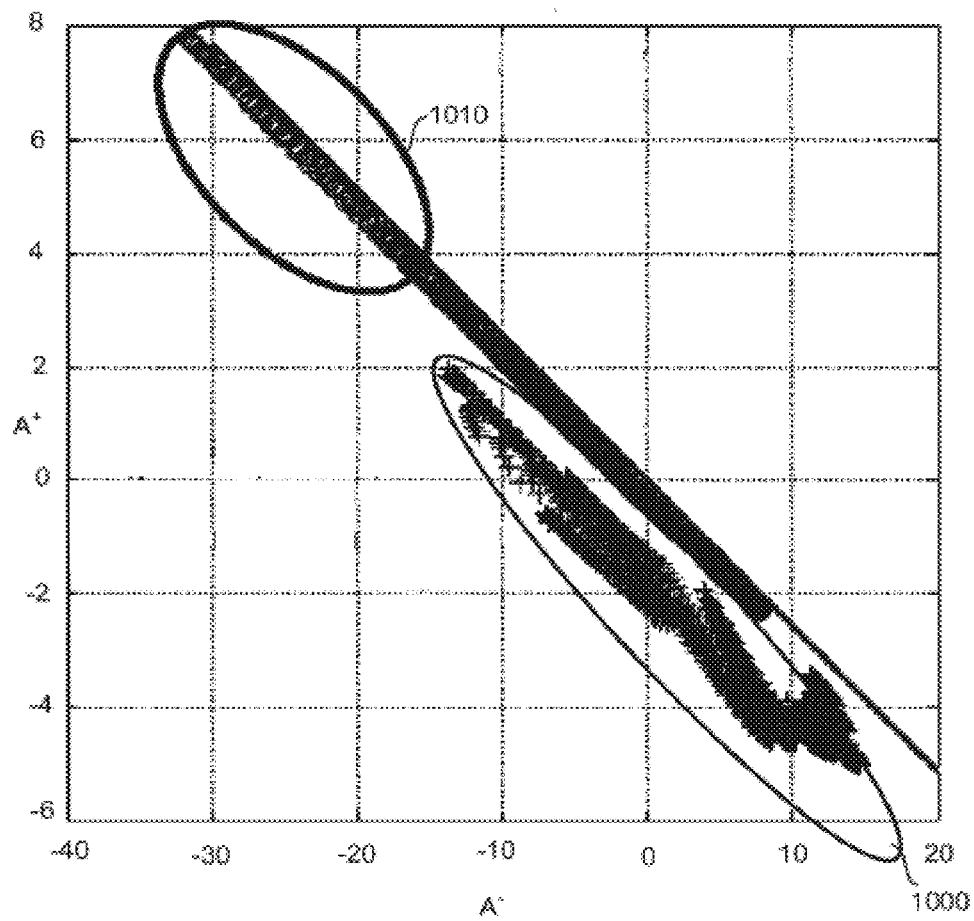
FIG. 17B is a plot of A+ against A− for an overlay target with feature asymmetry effects according to an embodiment.

FIG. 17A is a plot of A+ against A− for (simulated) data of different polarization-wavelength combinations, for an overlay target having no feature asymmetry effect. It can be seen that all the data fits on the same line, as already discussed. FIG. 17B shows a similar plot as that of FIG. 17A, but with a feature asymmetry effect present, specifically a 0.5 nm floor-tilt. In both FIGS. 17A and 17B, data marked by a circle represents TE radiation and data marked by a cross represents TM radiation. Although it cannot be seen here, position along the line is largely determined by wavelength (for a given polarization) such that shorter (violet) wavelengths tend to be found at the upper end of the line (A+=6 to 8), and the longer (red) wavelengths tend to be found at the lower end of the line.

From FIG. 17B it can be seen that wavelength- and polarization-dependent deviation from the linear relationship is observed in the region 1000 around the origin. Overlay sensitivity, in this example of a 0.5 nm floor-tilt, is smallest for TE polarization. Furthermore, data with the largest K-value (the proportionality factor between overlay and asymmetry in the measured radiation), i.e. the largest sensitivity to overlay, can also be easily identified, this being data 1010 which still shows a linear relationship farthest from the origin. The data 1010 in this example is for radiation in the short wavelength (violet) region. Consequently a plot such as this allows selection of an optimal metrology recipe which when used to measure a periodic structure, yields data 1010 most sensitive to overlay and least dependent on feature asymmetry effect.

In a practical metrology recipe optimization, a number of measurements over the substrate should be performed for different wavelengths and polarizations, such that all possible feature asymmetry effects on the substrate (e.g. at the edge) are considered. Once an optimum or desired recipe is selected, the measurements can be performed with this single recipe (e.g., wavelength-polarization-illumination angle combination).

If no single metrology recipe is providing sufficient feature asymmetry effect robustness, it may be possible to identify a combination of 2 or 3 metrology recipes using the A+ versus A− analysis explained above. This may be the case where each individual metrology recipe yields a cloud of data entries, and the line through 2 to 3 metrology recipes shows a non-zero axis cut-off; the slope of such a line would still yield overlay data that is relatively robust to feature asymmetry effects. To do this, 2 or 3 metrology recipes are used for the actual overlay measurements.

So, in an embodiment, the A+ versus A− analysis can be used to evaluate metrology recipes for a target having a periodic structure with a positive bias (A+) and a periodic structure with a negative bias (A−). So, for overlay as the performance parameter, A+ and A− is determined for each of the metrology recipes and the determined values of A+ are evaluated against the determined values of A− to yield a fitting through such data. A value related to that fitting corresponds to a more accurate value of the actual overlay for an instance of the target. For example, the slope of the line provides a measure of the overlay. Accordingly, in a calibration routine, with a set, known overlay, the metrology recipe that yields a slope value of its fitting at or close to the set, known overlay is a strong candidate to be the metrology recipe for high volume measurement.

Figure 18:
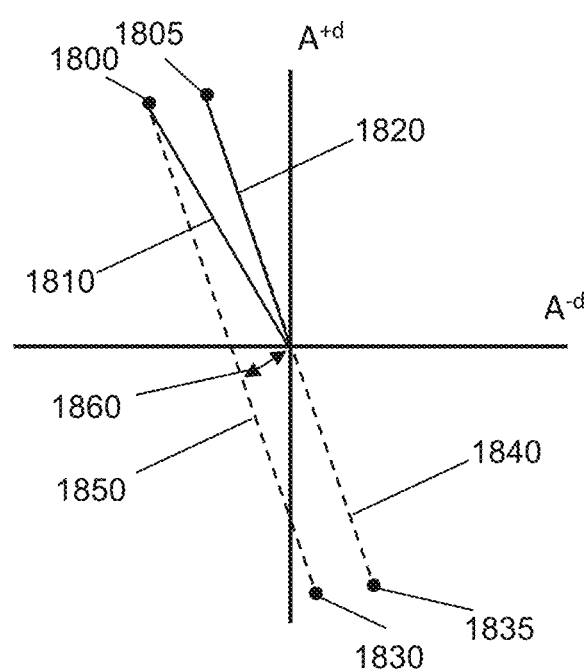
FIG. 18 is a plot of A+ against A− for an instance of an overlay target having no feature asymmetry effect and an instance of an overlay target having a feature asymmetry effect, according to an embodiment.

Referring to FIG. 18, there can be a significant variance in the results of measurement at a particular metrology recipe. For example, two example measurement results 1800, 1805 are shown in the plot of A+ against A− in FIG. 18 for a particular single metrology recipe (e.g., particular measurement radiation wavelength). In this case, each of the measurement results is associated with a same overlay but is of a different instance of a certain target. As shown by the slopes of the solid lines 1810, 1820, each measurement result 1800, 1805 would yield a very different overlay if it is assumed that there is no feature asymmetry effect (i.e., the lines pass through the origin). In fact, the instance of the target corresponding to measurement result 1800 has a significant feature asymmetry effect (e.g. structural asymmetry), while the instance of the target corresponding to measurement result 1805 does not. So, it can be seen that when a significant feature asymmetry effect (e.g., structural asymmetry, stack difference, etc.) is present, a single metrology recipe (e.g., a single wavelength) may give an error to the determined overlay, specifically the overlay as determined from measurement result 1800.

However, using measurements taken from multiple different metrology recipes (e.g., two different metrology recipes), the overlay can be determined more accurately as it is more robust to feature asymmetry effect. Referring to FIG. 18 again, two further example measurement results 1830, 1835 are shown in the plot of A+ against A− in FIG. 18 for a particular second metrology recipe (e.g., particular measurement radiation wavelength) that is different from the first metrology recipe for results 1800, 1805. As with measurements 1800, 1805, in this case, each of the measurement results 1830, 1835 is associated with a same overlay but is of a different instance of a certain target. The measurement result 1830 is of a same instance of the target as measurement result 1800 and the measurement result 1835 is of a same instance of the target as measurement 1805. As noted above, in fact, the instance of the target corresponding to measurement results 1800, 1830 has a significant feature asymmetry effect (e.g. structural asymmetry), while the instance of the target corresponding to measurement results 1805, 1835 does not.

But now, as shown by the slopes of the dotted lines 1840, 1850, the combination of measurement results 1800, 1805, 1830, 1835 would yield a substantially same overlay irrespective of the feature asymmetry effect. So, it can be seen that even with a significant feature asymmetry effect (e.g., structural asymmetry, stack difference, etc.) indicated by the distance 1860 of the line 1850 from the origin, two or more metrology recipes (e.g., a plurality of wavelengths) can yield a determined overlay that is fairly robust to feature asymmetry effect.

So, in an embodiment, two or more different metrology recipes are selected by which an instance of a target is measured and from which combination of results an overlay is determined that is robust to possible feature asymmetry effect for the instance of the target. That is, in an embodiment, there is provided a technique to choose an appropriate metrology recipe combination which can be used to provide an overlay result that is relatively to feature asymmetry effects or other sources of spurious intensity asymmetry (stack difference, structural asymmetry, etc.).

Figure 19:
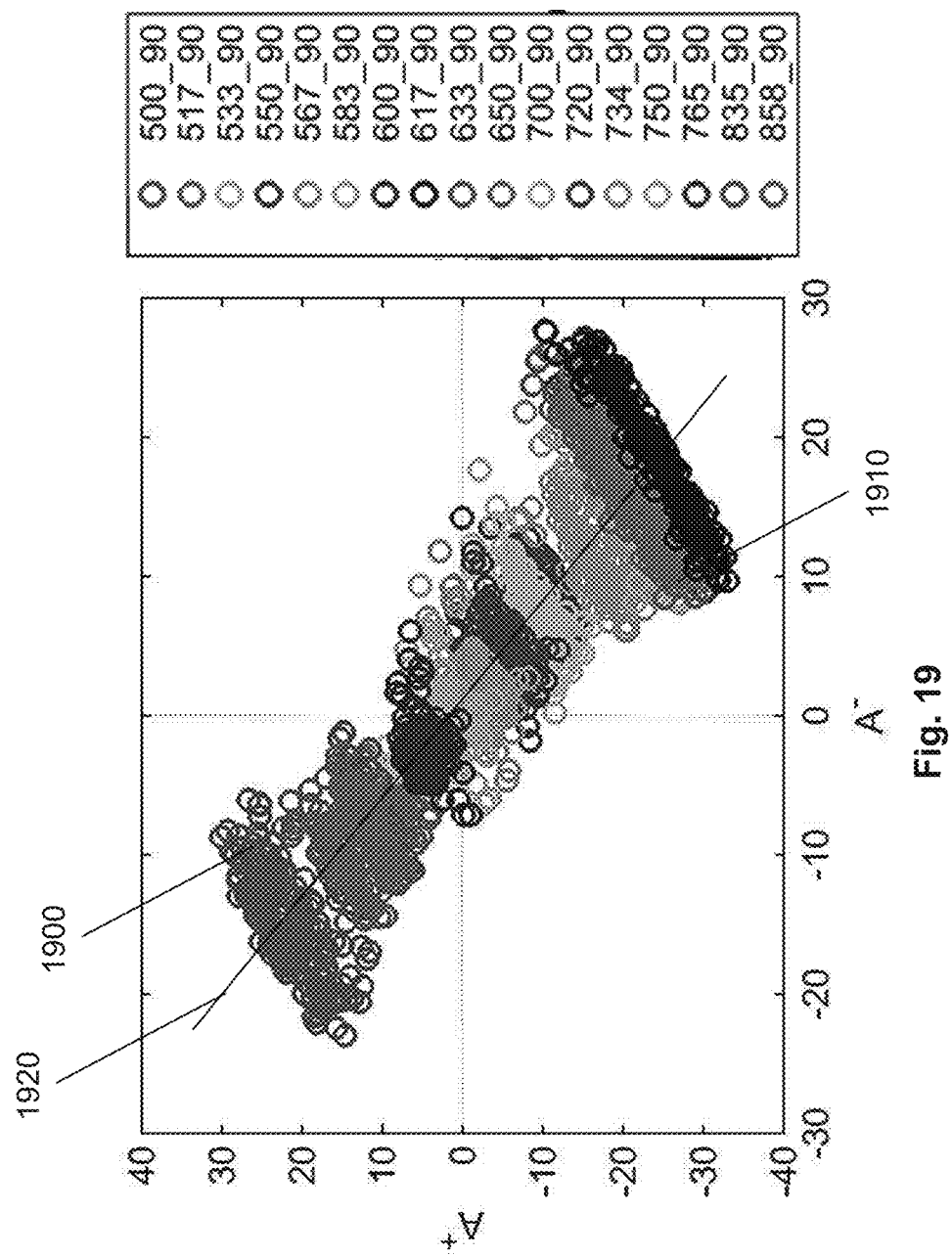
FIG. 19 is a plot of A+ against A− for instances of a target for a plurality of different metrology recipes according to an embodiment.

Referring to FIG. 19, there is depicted a plot of A+ against A− data for a plurality of instances of a target measured across a substrate, wherein each instance of the target is measured using a different metrology recipe. In this case, each metrology recipe differs in terms of measurement radiation wavelength, specifically certain different wavelengths within the range of 500 nm to 858 nm shown in the side bar of FIG. 19. Each metrology recipe in this example has the same polarization (90°) but as will be appreciated the polarization can be varied additionally or alternatively to the wavelength. Each circle in the plot of A+ against A− represents the data for a particular instance of the metrology target at different positions across the substrate.

As seen in FIG. 19 and compared to, e.g., FIG. 17A, there can be seen that there is a significant variation of these results relative to a line fit through the results. Now, some of the variance is attributable to there being different overlay values at different instances of the target. But, as will be discussed further, some of the variance is attributable to feature asymmetry effects. To consider the feature asymmetry effect in these results, a focus will be placed on two sets of results. A first set of results labelled 1900 corresponds to measurements of instances of the target with a metrology recipe comprising measurement radiation with a wavelength of 500 nm. A second set of results labelled 1910 corresponds to measurements of the same instances of the target with a metrology recipe comprising measurement radiation with a wavelength of 617 nm.

Figure 20:
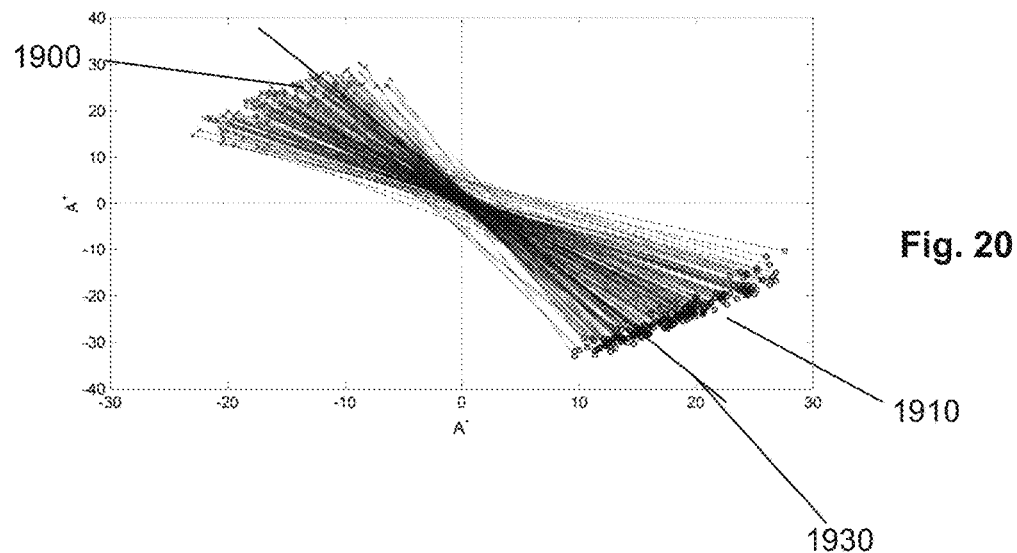
FIG. 20 is a plot of A+ against A− for a subset of the data presented in FIG. 19.

FIG. 20 depicts a plot of A+ against A− data for a plurality of instances of a target measured across a substrate, wherein each instance of the target is measured using a first metrology recipe comprising measurement radiation with a wavelength of 500 nm and using a second metrology comprising measurement radiation with a wavelength of 617 nm. The first set of results labelled 1900 corresponds to the first metrology recipe and the second set of results labelled 1910 corresponds to measurements of the same instances of the target with a metrology recipe comprising measurement radiation with a wavelength of 617 nm. Thus, FIG. 20 represents a subset of the data from FIG. 19. Further, in FIG. 20, the associated results using the first and second metrology recipes for a particular instance of the target are connected by a line. As can be generally seen in FIG. 20, a number of the lines pass through or very near the origin. Thus, the slope of those lines should provide a good measure of the overlay for those instances of the target. But, nevertheless, it can be generally seen that a number of the lines do not pass through the origin and so the slope of one or more those lines might not provide a good measure of the overlay for those instances of the target because they appear to be affected by a feature asymmetry effect.

Figure 21:
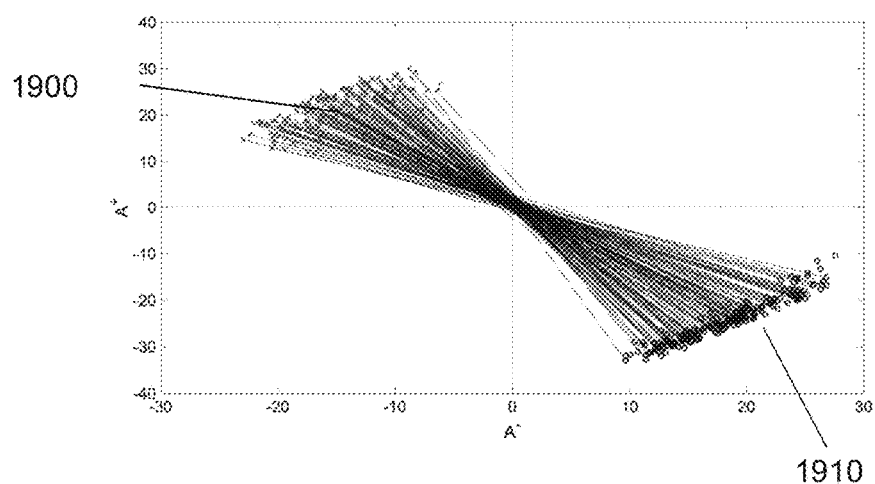
FIG. 21 is a plot of A+ against A− for the subset of the data presented in FIG. 20 with lines connecting only certain data corresponding to a central portion of the substrate.

FIG. 21 depicts a plot of A+ against A− data wherein the connecting lines of a subset of the data from FIG. 20 are depicted. In particular, the instances of the target whose lines are shown are those at, or near, a center of the substrate. As can be seen, in this subset of data, most of the lines connecting the results for the two metrology recipes of the same instances of the target pass through or very near the origin. Thus, each of the metrology recipes provide an accurate measurement of the overlay for those instances of the target since their results would pass on an A+ against A− line passing through or very near the origin. So, for those instances, either the first or the second metrology recipe could be used, as well both the first and second metrology recipes can be used, to obtain a relatively accurate measurement of overlay.

Figure 22:
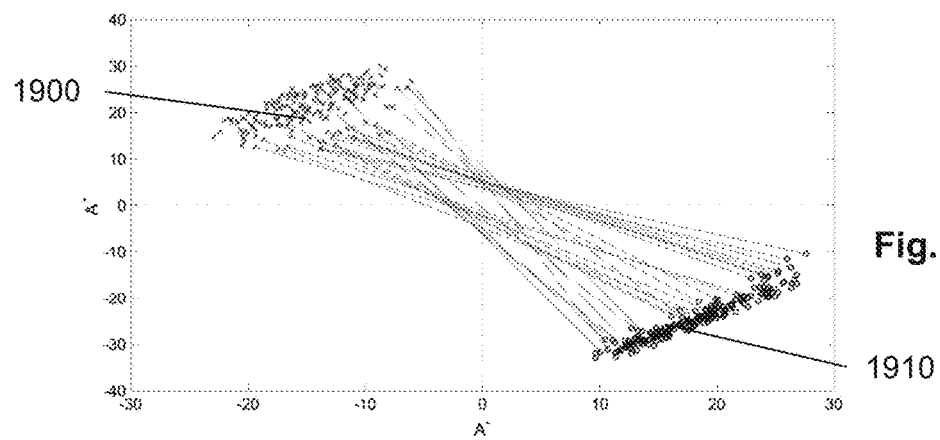
FIG. 22 is a plot of A+ against A− for the subset of the data presented in FIG. 20 with lines connecting only certain data corresponding to an edge portion of the substrate.

However, FIG. 22 depicts a plot of A+ against A− data, wherein the connecting lines of a different subset of the data from FIG. 20 than FIG. 21 are depicted. In particular, the instances of the target whose lines are shown are those at, or near, an edge of the substrate. As can be seen, in this subset of data, many of the lines connecting the results for the two metrology recipes of the same instances of the target do not pass through or very near the origin. Thus, each of the metrology recipes in and of themselves may not provide an accurate measurement of the overlay for those instances of the target since their results do not necessarily fall on an A+ against A− line passing through or very near the origin. However, having the results of two or more metrology recipes measuring an instance of a target can be help to identify the overlay in circumstances where there is a feature asymmetry effect.

But, as will be appreciated, it is typically not known in advance whether an instance of a target has a feature asymmetry effect. Accordingly, there is provided a technique to determine a combination of two or more different metrology recipes by which an instance of a target is measured and from which combination of results an overlay is determined that is robust to possible feature asymmetry effect for the instance of the target.

In an embodiment, the two or more metrology recipes are determined by determining a fitted curve, fitted function or statistic through the collective A+ against A− data for a plurality of different metrology recipes as a reference and then selecting at least two metrology recipes that have a variation of their collective A+ against A− data from the reference that meets or crosses a certain threshold (e.g., below an acceptable variation level). In an embodiment, the plurality of different metrology recipes for the reference comprises all the different metrology recipes under consideration and for which A+ against A− data is available. In an embodiment, the plurality of different metrology recipes for the reference comprises a subset of two or more different metrology recipes selected from a larger set of different metrology recipes and the reference is obtained for each subset of a plurality of such subsets so as to select at least one of the subsets as the selected at least two metrology recipes. In an embodiment, the selected subset has a variation of its collective A+ versus A− data from its reference that is less than that of another subset. The selected at least two metrology recipes can then be used to measure instances of the target in a high volume application to obtain a more accurate value of measured overlay.

Figure 23:
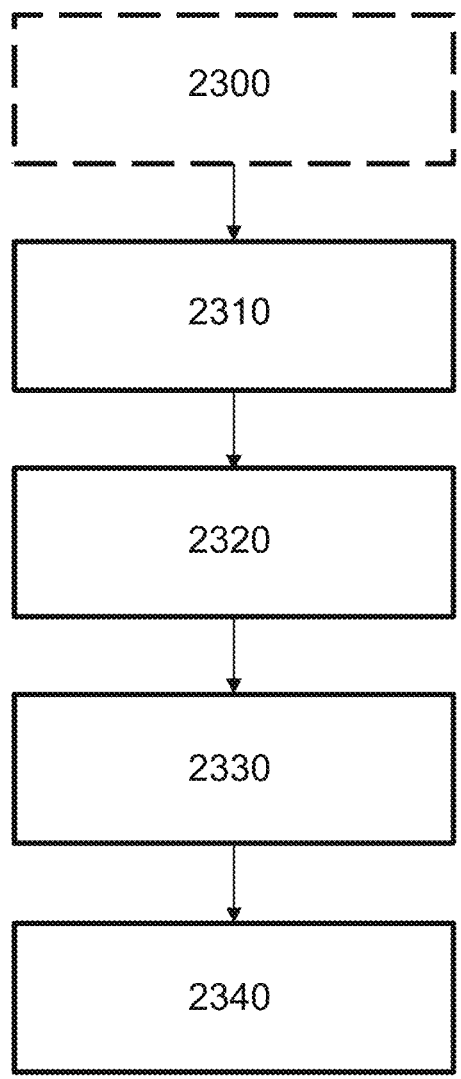
FIG. 23 is a flow chart of an embodiment of a method.

Referring to FIG. 23, a flow chart of an example method of determining the subset of metrology recipes is presented. In this example, two metrology recipes are identified. But a different plurality of metrology recipes could be identified. Further, the description below (and herein generally) focuses on A+ versus A− data as an example embodiment, but should be more generally understood as, for example, signal data for a first biased target structure of the metrology target (e.g., A+ data) and signal data for a second differently biased target structure of the metrology (e.g., A− data). In an embodiment, that respective signal data is asymmetry optical parameter data, for example, asymmetry in intensity of diffraction orders.

At 2310, signal data for a first biased target structure of the metrology target (e.g., A+ data) and signal data for a second differently biased target structure of the metrology (e.g., A− data) for each metrology recipe of a plurality of different metrology recipes is obtained for a particular target processed using a particular patterning process. In an embodiment, the plurality of metrology recipes comprises three or more metrology recipes. In an embodiment, the metrology recipes are different in terms of one more measurement parameters. In an embodiment, two or more of the metrology recipes are different in terms of measurement beam wavelengths. In an embodiment, two or more of the metrology recipes are different in terms of measurement beam polarization types. In an embodiment, two or more of the metrology recipes are different in terms of measurement beam illumination incident angle on the target. In an embodiment, the metrology recipes for which A+ and A− data is obtained is user specified. In an embodiment, the metrology recipes for which A+ and A− data is obtained corresponds to all, or a certain subset, of combinations of two or more selected from: one or more specific wavelengths available in an inspection apparatus, one or more specific polarizations available in the inspection apparatus, and/or one or more specific illumination incident angles available in the inspection apparatus.

In an embodiment, A+ versus A− data can be defined in different manners. For example, the A+ versus A− can be specific to one substrate or a plurality of substrates, specific to a certain position on one or more substrates, specific to a particular instance of a target (e.g., evaluated at a pixel level), specific to a particular pixel of obtained images (e.g., using data from multiple substrates or instances of the target), etc.

For example, in an embodiment, the A+ versus A− data can be obtained for a plurality of instances of the target across one or more substrates, such as plotted in FIG. 19; for example, average intensity values of $+1^{st}$ and $-1^{st}$ diffraction order radiation from differently biased periodic structures of the instances of the target across the substrate can be obtained to create the A+ versus A− data.

In an embodiment, the A+ versus A− data can be obtained for a particular location on one or more substrates; for example, average intensity values of $+1^{st}$ and $-1^{st}$ diffraction order radiation from differently biased periodic structures of the instances of the target at a same location on a plurality of substrates can be obtained to create the A+ versus A− data. For example, the data can be obtained from a lot of substrates.

Figure 24:
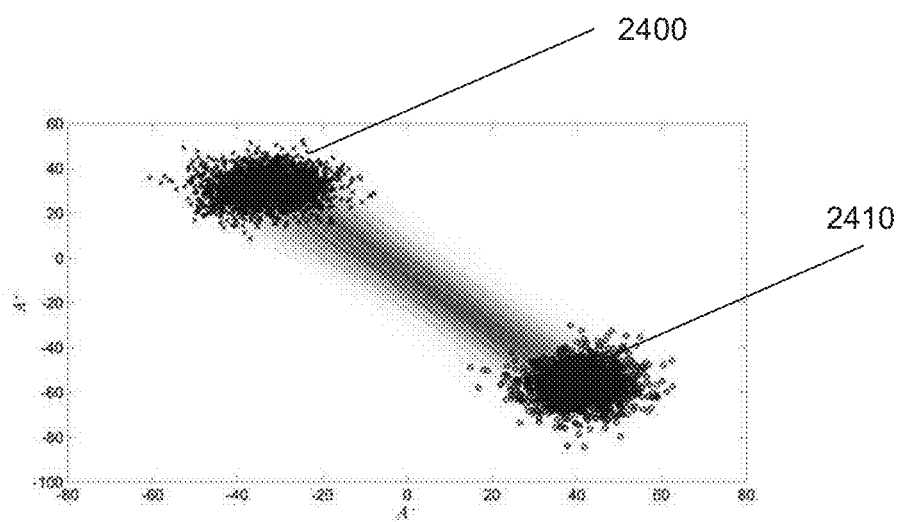
FIG. 24 is a plot of A+ against A− for individual pixels of an image of a target for a plurality of different metrology recipes according to an embodiment.
Figure 25:
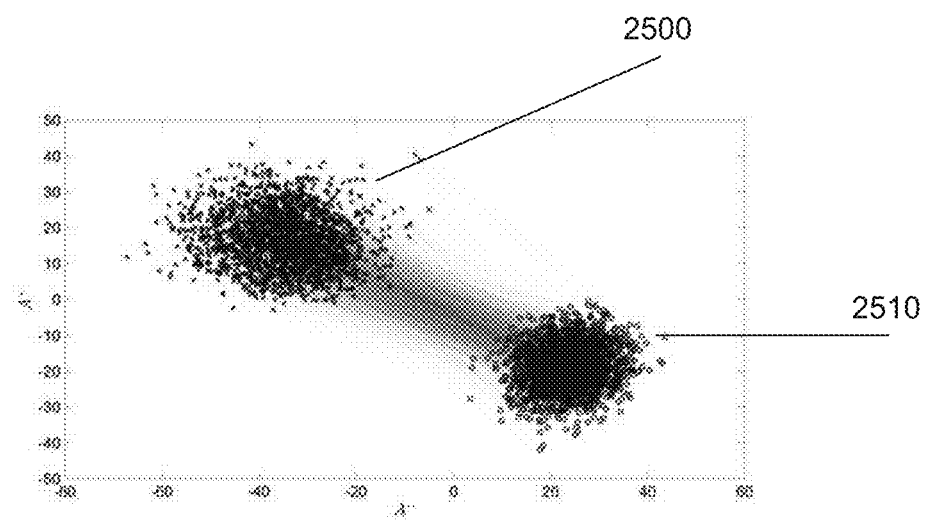
FIG. 25 is a plot of A+ against A− for individual pixels of an image of a target for a plurality of different metrology recipes according to an embodiment.

In an embodiment, the target can be analysed at a pixel level to obtain the A+ versus A− data or overlay values at a pixel level for a periodic structure. In an embodiment, the pixels corresponds to the pixels of the detector of an inspection apparatus used to acquire the A+ and A− or overlay data and/or of an image produced by the detector of an inspection apparatus used to acquire the A+ and A− or overlay data. For example, the X− and X+ images of FIGS. 11F and 11G can be analysed at a pixel level to obtain the data for a pixel. In an embodiment, the pixels of the X− and X+ images used to generate the data is selected in a raster scan fashion from left to right and top to bottom. So, for example, radiation data for the top left corner pixel from the X− image is used as the A− data in combination with the top left corner pixel from the X+ image as the A+ data and then the A+ and A− data is obtained from subsequent pixels that are selected in raster scan fashion. As will be appreciated, the association between pixels from the X− and X+ images can be selected in a different fashion. So, in an embodiment, the pixel level data can be specific to a specific instance of the target. In an embodiment, the pixel level data can be obtained for a plurality of instances of the target across one or more substrates (thus distinguished from an average intensity from the X− and X+ images). Embodiments of such pixel level data as A+ versus A− data are depicted in FIGS. 24 and 25, wherein each circle corresponds to the data from an individual pixel. In FIGS. 24 and 25, there are two metrology recipes differing in terms of the measurement beam wavelength used. In FIG. 24, the data 2400 corresponds to data being obtained using a measurement beam wavelength of 500 nm while data 2410 corresponds to data being obtained using a measurement beam wavelength of 583 nm. In FIG. 25, the data 2500 corresponds to data being obtained using a measurement beam wavelength of 517 nm while data 2410 corresponds to data being obtained using a measurement beam wavelength of 650 nm.

In an embodiment, the pixel level data can be specific to a particular pixel. For example, in an embodiment, the specific pixel level data can be obtained for a plurality of instances of the target across one or more substrates (thus distinguished from an average intensity from the X− and X+ images) and/or from one instance of the target across a plurality of substrates.

At 2320, a curve, function or statistic through the obtained data for two or more of the different metrology recipes is determined by, for example, regression, as a reference. Examples of such a curve or function (in the form of a linear line or function) for A+ versus A− data as a reference are one or more of the lines shown in FIGS. 14-16 and 18. Thus, the curve or function effectively forms a reference fitting for the data (e.g., A+ versus A− data). In an embodiment, the statistic is an average or measure of the spread of the slopes of corresponding data for two metrology recipes (e.g., the overlay as determined from slopes of A+ versus A− data as described above). As noted above, the data (e.g., A+ versus A− data) can be differently specified and so the reference can be specific to a particular substrate of a patterning process, specific to a particular position on a substrate of the patterning process, specific to a particular pixel of a target on the substrate of the patterning process, etc.

In an embodiment, the combination of different metrology recipes for determining the reference comprises all the different metrology recipes under consideration and for which data is available. In an embodiment, the plurality of different metrology recipes for determining the reference comprises a subset of two or more different metrology recipes selected from a larger set of different metrology recipes and a reference is obtained for each subset of a plurality of such subsets (so as to select at least one of the subsets).

At 2330, at least two metrology recipes are selected that have a variation of their collective data (e.g., collective A+ against A− data) from a parameter of the reference that meets or crosses a certain threshold (e.g., below an acceptable variation level) such that, desirably, at least one metrology recipe of the plurality of metrology recipes evaluated is ruled out. For example, identifying the at least two metrology recipes that have a low variation from the parameter of the reference identifies the at least two metrology recipes as being relatively robust to feature asymmetry effect. So, for example, at least two metrology recipes are selected that would have lines connecting many, if not all, of their corresponding A+ against A− data points that are relatively highly parallel, even if, e.g., those lines are offset from the origin. Even if offset, the slope of those lines are representative of the overlay. As examples, the parameter can be the statistic of the reference, a slope of a reference fitted line, or a coefficient of a reference fitted function.

For example, in an embodiment, the combination of different metrology recipes for the reference comprises all the different metrology recipes under consideration and for which data (e.g., A+ against A− data) is available. So, the at least two metrology recipes selected are a subset of two or more different metrology recipes selected from that combination whose collective data (e.g., collective A+ against A− data) has a variation from the reference parameter that meets or crosses a certain threshold. For example, various subsets selected from the combination (each subset comprising two or more different metrology recipes although one or more of the subsets can share a same metrology recipe) can be evaluated to identify which subset (or several subsets) has a lowest variation in its data from the reference parameter. In an embodiment, this can involve determining a curve or function fitting through collective A+ against A− data of the subset under consideration and evaluating the variation of a parameter of that subset's specific curve or function against the reference parameter for each of the subsets to identify a subset as the selected at least two metrology recipes (e.g., the subset with the lowest variation from the reference curve or function or the 10 or less subsets, 5 or less subsets or the 2 subsets with the lowest variation from the reference curve or function). As a specific example and referring to FIGS. 19 and 20, the slopes of lines through A+ against A− data of the subsets (e.g., the slope of line 1930 as an example slope of one subset of two different metrology recipes) can be evaluated against a slope of a reference fitted line (e.g., the slope of line 1920 as an example of slope of a reference fitted line through all the different metrology recipes under consideration and for which A+ against A− data is available) to identify the one or more subsets with a slope that is nearest to the slope of the reference as the selected at least two metrology recipes. As another example, the reference can be a measure of spread (e.g., variance or standard deviation) of the slopes between associated data points within the A+ against A− data and the measure of spread of the slopes between associated data points within the A+ against A− data for a subset under consideration can be compared to the reference measure of spread to identify a closest match. So, effectively in this embodiment, in terms of a curve (e.g., line) fitting through A+ against A− data for a plurality of different metrology recipes, the at least two selected metrology recipes are those that have a curve (e.g., a line) fitting through their respective data that is parallel, or has parallelism that meets or crosses a certain threshold (e.g., is below a certain threshold), with the reference fitting curve through the data of the plurality of metrology recipes.

As another example, in an embodiment, the plurality of different metrology recipes for the reference comprises a subset of two or more different metrology recipes selected from a larger set of different metrology recipes and the reference is obtained for each subset of a plurality of such subsets (wherein each of the subsets has a metrology recipe that differs from another subset although one or more of the subsets can share a same metrology recipe) so as to select at least one of the subsets as the selected at least two metrology recipes. In an embodiment, the selected subset has a variation of its collective data from a parameter of its reference that is less than that of another subset. So, in effect, a plurality of subsets, each subset having a different combination of two or more metrology recipes than the other subsets, are each individually evaluated to determine the variation of its collective data from a parameter of the reference for its collective data to identify the subset with the lowest variation from a parameter of its own reference or the 10 or less subsets, 5 or less subsets or the 2 subsets with the lowest variation from their respective own references. As an example, referring to FIGS. 24 and 25, a measure of the spread of the slopes of the depicted lines (each line corresponding to a pixel) can be determined for each combination of metrology recipes presented therein. Then, the combination of metrology recipes with a low or lowest spread can be selected. For example, a standard deviation or variance (e.g., 3 standard deviations) of the overlays as determined for the pixels from, e.g., associated A+ versus A− data (e.g., by calculating the slopes of the lines) can be calculated for each of FIGS. 24 and 25 and then their standard deviations or variances compared to identify the lowest one for selection as the at least two selected metrology recipes. So, in this specific case, the metrology recipes associated with FIG. 24 would be selected as they visually (and numerically) present a lower spread than FIG. 25.

Further, in an embodiment, the selection of the at least two metrology recipes based on A+ against A− data can consider a distance of the data for each of the metrology recipes from the origin of the A+ against A− data. For example, a centroid of the A+ against A− data for a metrology recipe can be determined and its distance from the origin calculated. With such a distance for each of the recipes of a combination of metrology recipes under consideration, a combination of those distances (e.g., average of the distances) can be evaluated against a threshold to determine whether the combination of distances meets or exceeds the threshold. In an embodiment, the threshold can be a combination of the distances of another combination of metrology recipes under consideration. By such selection, a combination of metrology recipes that is generally furthest from the origin can be favored since metrology recipes that have their data furthest from the origin tend to have good sensitivity to overlay.

So, as a summary in the context of A+ versus A− data, data that yields a fitted line through the origin (such as depicted in FIG. 16) means that the metrology target as measured in the patterning process will yield overlay results that are relatively robust against feature asymmetry effects. But, while a line of A+ versus A− data merely offset from the origin (such as depicted in FIG. 17) means there is a feature asymmetry effect, the slope of the line can be used to determine or correct overlay. But, it is not certain for data from a single metrology recipe whether a line for that A+ versus A− data goes through the origin (or is merely offset therefrom) in which it could give a good overlay result from its slope or the A+ versus A− data has a tilt other than due to overlay (such as depicted in FIG. 18) such that there wouldn't be a good overlay result from its data. So, a combination of metrology recipes that would yield a line of A+ versus A− data that is essentially parallel to a line of A+ versus A− data representative of the metrology target having no feature asymmetry effect or having merely an offset due to feature asymmetry effect means an overlay derived from the slope of that line is relatively robust against feature asymmetry effect, whereas a combination of metrology recipes that would yield a line of A+ versus A− data that intersects a line of A+ versus A− data representative of the metrology target having no feature asymmetry effect or having merely an offset due to feature asymmetry effect means that combination is not so robust to feature asymmetry effect (despite the fact that the metrology recipes for such an intersecting line might otherwise be good metrology recipes chosen from a swing curve as described below for example). Accordingly, by identifying a combination of metrology recipes that effectively has a high degree of parallelism among A+ versus A− lines of its data, the identified combination of metrology recipes can help assure measurements using those metrology recipes yield overlay values robust against most, if not all feature asymmetry effects (without, e.g., having to determine the feature asymmetry in of itself). So, in an embodiment, metrology recipe selection (and overlay analysis method) does not require any stack information to perform.

As a result of step 2330, a plurality of metrology recipes (e.g., measurement wavelengths) should remain after the foregoing evaluation (of course, if no satisfactory metrology recipes remain then one or more other metrology recipe parameters may need to be modified, e.g., one or more parameters of the target itself). At this point, the selected metrology recipes could be output for use in step 2340.

Then, at 2340, the at least two selected metrology recipes can be used to measure the target to obtain a more accurate result of overlay from the target. That is, in an embodiment, the results from a measurement of the target using the at least two selected metrology recipes can be combined to yield a more accurate value of overlay. For example, A+ versus A− data can be obtained using the at least two selected metrology recipes and determine overlay from that data (e.g., determining a slope of line fit through the data). As another example, two or more overlay values can be determined from measurements using the selected at least two metrology recipes and then be statistically combined (e.g., averaged) to yield a more accurate overlay value. In an embodiment, the selected at least two metrology recipes are used to measure instances of the target in a high volume application to obtain a more accurate value of measured overlay.

So, in effect, there is provided an optimization process to select at least two different metrology recipes to measure a metrology target to determine an overlay value by selection of the combination of metrology recipes that is, e.g., least sensitive to feature asymmetry effect.

Optionally, at 2300, a plurality of different metrology recipes can be chosen for obtaining A+ and A− data. Since an inspection apparatus may be able to offer, e.g., numerous measurement radiation wavelengths, numerous polarizations, numerous measurement radiation illumination angles, etc., there can be many different combinations which would require, e.g., a significant amount of measurement to obtain the data for the selection of the at least two metrology recipes. So, in an embodiment, the plurality of different metrology recipes for which A+ and A− data is obtained can be pre-selected from a larger set of metrology recipes by evaluating different metrology recipes against one or more particular parameters or indicators. In an embodiment, that can involve using swing curve data as described in more detail hereafter.

While various steps are described in sequence hereafter for such pre-selection, they need not necessarily be performed in that sequence. Further, all steps need not be performed. For example, one or more of the step may be performed. So, any combination selected from the steps can be performed.

The pre-selection can involve an analysis of overlay data for a metrology target against a plurality of different wavelengths. The data can be obtained experimentally or obtained from production measurements using the target. For example, a plurality of instances of a target under consideration can be printed across a substrate using the patterning process for which the target will be used and then each instance measured with the applicable metrology apparatus at a plurality of different settings (e.g., different wavelengths). Additionally or alternatively, the overlay measurement resulting from using a metrology recipe to measure a target may be simulated. In the simulation, one or more parameters of the measurement are determined using (e.g., provided by, or determined from) the parameters $r_i$ and/or $t_j$ of the metrology recipe. For example, the interaction between the radiation and the target corresponding to the metrology recipe can be determined from those parameters of the metrology recipe by using, for example, a Maxwell solver and rigorous coupled-wave analysis (RCWA) or by other mathematical modelling. So, the measurement expected using the target and the associated metrology recipe can be determined from the interaction. So, in certain circumstances, for example to determine targets and/or metrology recipes that yield strong signals, the data can be obtained using a simulator of the measurement process; the simulator can mathematically derive how a particular target of particular characteristics (e.g., a target specified in terms of pitch, feature width, material types, etc.) would be measured using a metrology apparatus according to the measurement technique (e.g., diffraction-based overlay measurement) of the inspection apparatus using a particular metrology recipe by, for example, calculating the intensity that would be measured in a detector of, e.g., the apparatus of FIG. 7. To obtain robustness data, the simulator can introduce a perturbation within a certain range (e.g., an up to 10% change, an up to 5% change, an up to 2% change, an up to 1% change, or an up to 0.5% change) to mimic process variation (which can be extended across a substrate).

So, the experimental method or simulation can yield values for particular parameters or indicators such as OV, K, etc. using, for example, the formulas described above.

One such indicator is stack sensitivity (SS) (also considered as signal contrast). Stack sensitivity can be understood as a measure of how much the intensity of the signal changes as overlay changes because of diffraction between target (e.g., grating) layers. That is, in an overlay context, it detects the contrast between upper and lower periodic structure of an overlay target and thus represents a balance between diffraction efficiencies between the upper and lower periodic structure. It is thus an example measure of sensitivity of the measurement. In an embodiment, stack sensitivity is the ratio between intensity asymmetry and average intensity. In an embodiment, stack sensitivity can be formulated as $SS=K \cdot L/I_M$, wherein L is a user defined constant (e.g., in an embodiment, the value L is 20 nm and/or the value of the bias d) and $I_M$ is the mean intensity of the measurement beam diffracted by the target. In an embodiment, the stack sensitivity for a metrology recipe should be maximized. However, use of a metrology recipe with maximum stack sensitivity may not be best. For example, a measurement beam wavelength for which stack sensitivity is maximum may correspond to low overlay sensitivity and poor process robustness.

Figure 26:
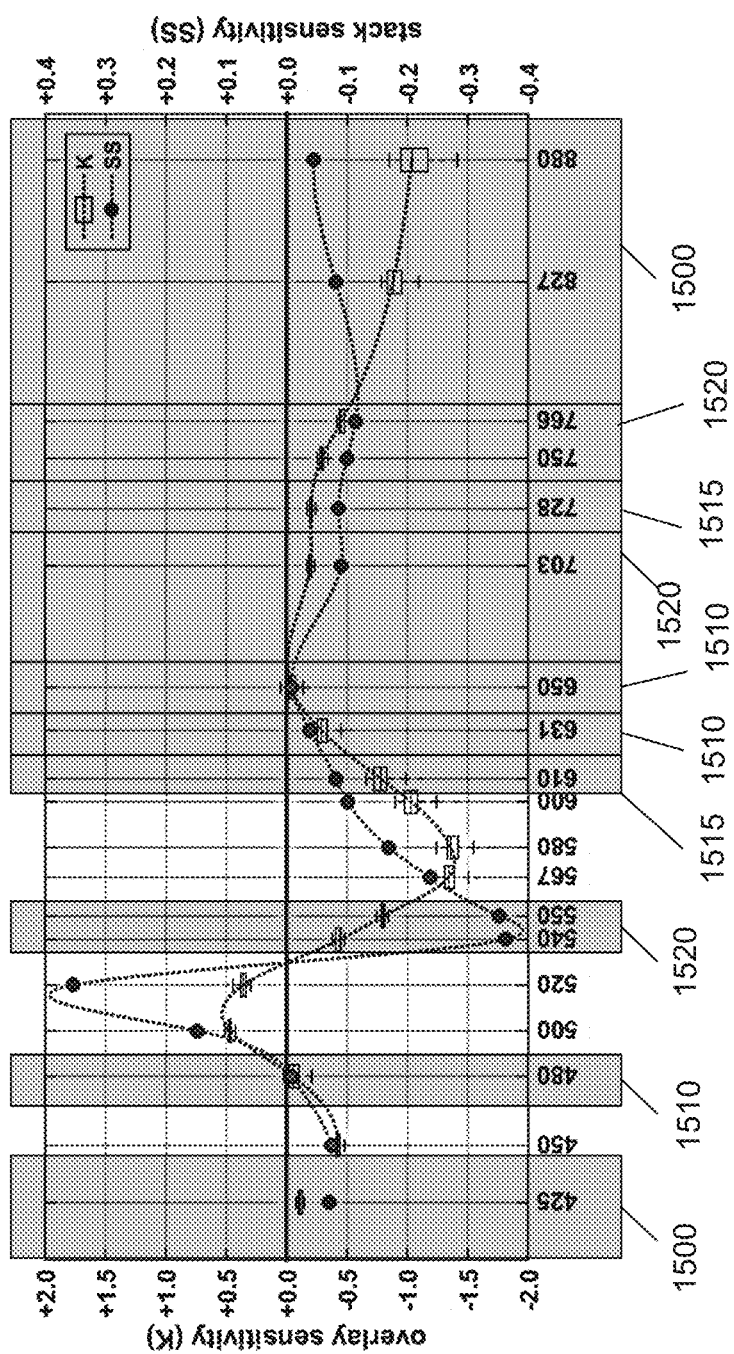
FIG. 26 is a graph of overlay sensitivity and stack sensitivity for a target for measurement at various wavelengths for a single polarization (in this case, linear X polarization)
Figure 27:
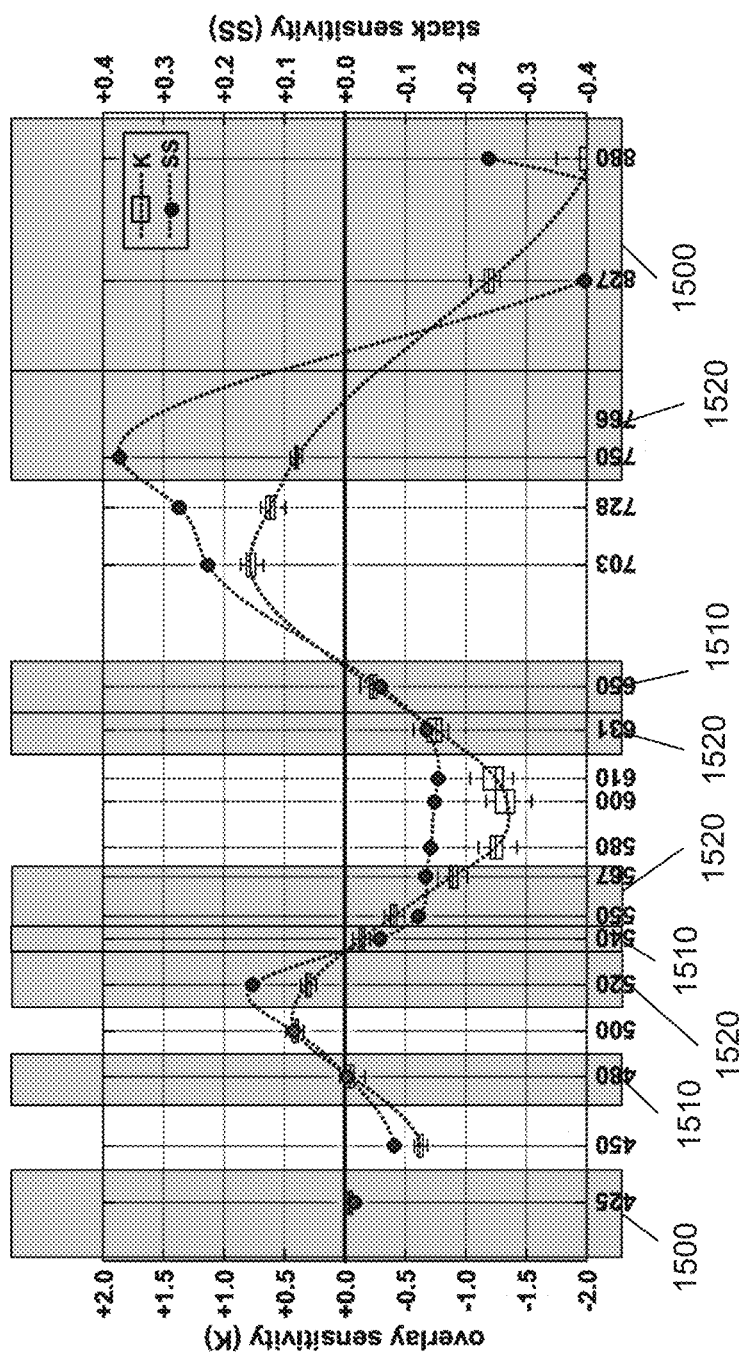
FIG. 27 is a graph of overlay sensitivity and stack sensitivity for a target for measurement at various wavelengths for a single polarization (in this case, linear Y polarization)

Examples of metrology recipe data are presented in FIGS. 26 and 27. The data can represent a dependency of measurement data as a function of one or more metrology recipe parameters, in particular one or more parameters of the measurement itself such as wavelength of the measurement beam. In an embodiment, the data can represent an oscillatory dependence of measured data (e.g., intensity obtained as field data (at an image plane) or pupil data (at pupil plane)) as a function of measurement radiation wavelength. FIG. 26 is an example graph of data for a target for measurement at various wavelengths for a single polarization (in this case, linear X polarization). A curve has been fitted through the data and so this representation can be called a swing curve. As will be appreciated, a graph need not be generated as just the data can be processed. FIG. 27 is a graph of data for the same target for measurement at various wavelengths for a different single polarization (in this case, linear Y polarization). In both FIGS. 26 and 27, stack sensitivity and overlay sensitivity are graphed for various measurement beam wavelengths. Further, while the polarizations here are linear X and Y polarization, it can be different or additional polarizations (such as left-handed elliptically polarized radiation, right-handed elliptically polarized radiation, etc.)

Using this data, one or more certain metrology recipes (e.g. wavelengths) are removed from consideration to result in a selection of a set of metrology recipes for possible further consideration. In this case, the metrology recipes share the same target but vary in terms of measurement radiation wavelength.

Now, certain wavelengths can be eliminated because they are beyond the pitch/wavelength limit for that particular target. That is, the pitch of the target features and the measurement radiation wavelength are such that measurement at this combination would be ineffective. These one or more metrology recipes are excluded in regions 1500.

A possible aspect of this selection is to select those one or more metrology recipes with a stack sensitivity (e.g., a mean stack sensitivity obtained from a plurality of instances of a target across a substrate (which can then be determined for a plurality of substrates)) that meets or crosses a threshold (i.e., within a certain range of stack sensitivity values). In an embodiment, the stack sensitivity should be maximized (but as discussed above, not at the expense of other indicators or parameters and moreover, there may be an upper limit on stack sensitivity that can affect robustness to process variation). For example, the one or more metrology recipes with an absolute value of stack sensitivity of greater than or equal to 0.05 can be selected for further consideration. Of course, 0.05 need not be used. If the number is higher in this case, more metrology recipes would be excluded. So, the stack sensitivity number in this case is relatively low. So, those one or more metrology recipes excluded by this aspect of the selection are marked as regions 1510 (where the regions roughly correspond to the wavelengths available by the inspection apparatus in this circumstance; the analysis as applied to the curve in FIGS. 26 and 27 would be more precise if a continuous wavelength range were available and the inspection apparatus can precisely and stably tune to any wavelength in the range).

A possible aspect of this selection is consideration of target sigma. Target sigma (TS) can be understood as the statistical variation of the measured parameter (e.g., overlay) for a plurality of measured pixels across a target. In theory, each pixel should be measured by a detector to read a same parameter value for a particular target. However, in practice, there can be variation among the pixels. In an embodiment, target sigma is in the form of a standard deviation or the form of variance. So, a low value of target sigma means a desirable low variation in the measured parameter across the target. A high value of target sigma (TS) can signal an issue in printing of the target (e.g., a misformed grating line), an issue of contamination (e.g., a significant particle on the target), an issue in measurement beam spot positioning, and/or an issue in measurement beam intensity variation across the target.

So, a further aspect of this selection can be to select those one or more metrology recipes with a target sigma (e.g., a mean target sigma obtained from a plurality of instances of a target across a substrate (which can then be determined for a plurality of substrates)) that meets or crosses a threshold (i.e., within a certain range of target sigma values). In an embodiment, the target sigma should be minimized. For example, the one or more metrology recipes with a target sigma of less than or equal to 10 nm can be selected for further consideration. Of course, 10 nm need not be used. If the number is lower in this case, more metrology recipes would be excluded. So, the target sigma number in this case is relatively high. So, those one or more metrology recipes excluded by this aspect of the selection are marked as regions 1515 (where the regions roughly correspond to the wavelengths available by the inspection apparatus in this circumstance).

To, e.g., reduce the measured error in overlay, a set of measurement conditions (e.g., target selection, measurement beam wavelength, measurement beam polarization, etc.) could be selected with a large overlay sensitivity K. So, a possible aspect of this selection is to select those one or more metrology recipes with an overlay sensitivity (e.g., a mean overlay sensitivity obtained from a plurality of instances of a target across a substrate (which can then be determined for a plurality of substrates)) that meets or crosses a threshold (i.e., within a certain range of overlay sensitivity values). In an embodiment, the overlay sensitivity should be maximized for a metrology recipe. For example, the one or more metrology recipes having an absolute value of overlay sensitivity within a range of the absolute value of highest overlay sensitivity can be selected for further consideration. For example, the range can be within 35%, within 30%, within 25%, within 20%, within 15% or within 10% of the highest overlay sensitivity value. For example, the one or more metrology recipes within a range from a local minima or maxima of the overlay sensitivity values can be selected. For example, the range can be within 35%, within 30%, within 25%, within 20%, within 15%, or within 10% of the local minima or maxima. Of course, different ranges can be used. The higher the range, the more metrology recipes retained. So, those one or more metrology recipes excluded by this aspect of the selection are marked as regions 1520 (where the regions roughly correspond to the wavelengths available by the inspection apparatus in this circumstance).

A possible aspect of this selection is consideration of a stack difference parameter against a threshold. In an embodiment, the stack difference parameter comprises periodic structure imbalance (GI). So, for example, a subset of one or more metrology recipes can be selected by evaluating grating imbalance (GI) (e.g., a mean grating imbalance or a variation (e.g., variance, standard deviation, etc.) of grating imbalance, obtained from a plurality of instances of a target across a substrate (which can then be determined for a plurality of substrates)) against a threshold. For example, the one or more metrology recipes with a grating imbalance of less than or equal 0.05 or 5% can be selected for further consideration. Of course, 0.05 or 5% need not be used. In an embodiment, the stack difference parameter is minimized.

The result of consideration of one or more of these parameters or indicators can yield a pre-selection of metrology recipes for obtaining A+ and A− data. Further, while the focus has been on wavelength, other measurement parameters can be considered such as polarization, measurement beam illumination incident angle, etc.

Figure 28:
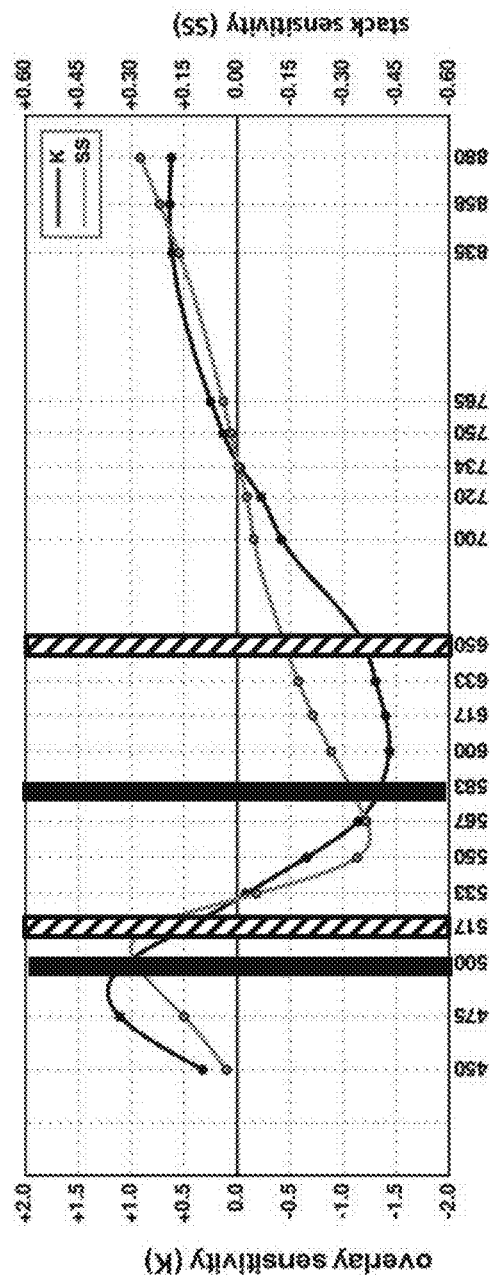
FIG. 28 is a graph of overlay sensitivity and stack sensitivity for a target for measurement at various wavelengths.

Referring to FIG. 28, overlay sensitivity and stack sensitivity are plotted for a plurality of wavelengths in the form of a swing curve. Example wavelengths of interest are marked as 500 nm, 517 nm, 583 nm and 650 nm. Those highlighted wavelengths have a relatively high absolute value of stack sensitivity and also a relatively high absolute value of overlay sensitivity. Accordingly, those wavelengths would be good candidates for use in overlay measurement and would at least be good candidates for use in the process of FIG. 23. For example, those wavelengths could be pre-selected for the process of FIG. 23. Now, example data obtained by using those wavelengths are depicted in FIGS. 24 and 25. In particular, data for measurement using 500 nm and 583 nm are depicted in FIG. 24 and data for measurement using 517 nm and 650 nm are depicted in FIG. 25. But, even though those individual wavelengths would be good candidates for measuring overlay as determined by an example swing curve analysis as described above, the technique of FIG. 23 described above shows that, for the metrology target and patterning process for the data of FIGS. 24 and 25, 500 nm and 583 nm measurement radiation is superior than 517 nm and 650 nm measurement radiation for measuring the metrology target.

Figure 29:
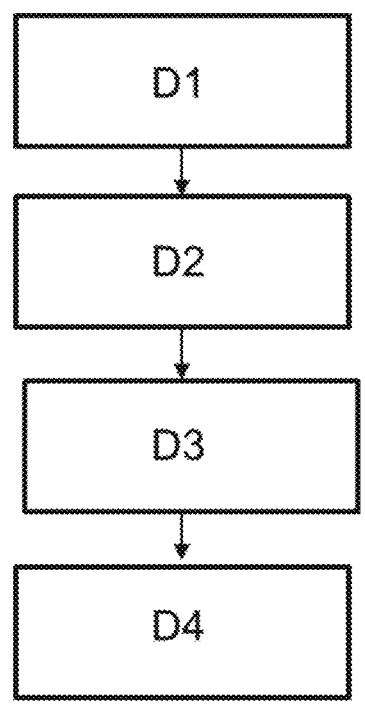
FIG. 29 is a flowchart illustrating a process in which the metrology target is used to monitor performance, and as a basis for controlling metrology, design and/or production processes.

FIG. 29 shows a flowchart illustrating a process in which the at least two different metrology recipes are used to monitor performance, and as a basis for controlling metrology, design and/or production processes. In step D1, substrates are processed to produce product features and one or more metrology targets as described herein according to the applicable metrology recipe. At step D2, patterning process parameter (e.g., overlay) values are measured using the at least two selected different metrology recipes and calculated. At optional step D3, the measured patterning process parameter (e.g., overlay) value may be used (together with other information as may be available), to update the metrology recipe (e.g., change a wavelength). The updated metrology recipe is used for re-measurement of the patterning process parameter, and/or for measurement of the patterning process parameter on a subsequently processed substrate. In this way, the calculated patterning process parameter is improved in accuracy. The updating process can be automated if desired. In step D4, the patterning process parameter value is used to update a recipe that controls the lithographic patterning step and/or other process step in the device manufacturing process for re-work and/or for processing of further substrates. Again this updating can be automated if desired.

In an embodiment, there is provided a method comprising: for a metrology target, having a first biased target structure and a second differently biased target structure, created using a patterning process, obtaining metrology data comprising signal data for the first target structure versus signal data for the second target structure, the metrology data being obtained for a plurality of different metrology recipes and each metrology recipe specifying a different parameter of measurement; determining a statistic, fitted curve or fitted function through the metrology data for the plurality of different metrology recipes as a reference; and identifying at least two different metrology recipes that have a variation of the collective metrology data of the at least two different metrology recipes from a parameter of the reference that crosses or meets a certain threshold.

In an embodiment, the method comprises determining the fitted curve or function and wherein the curve or function is linear. In an embodiment, the parameter is a statistical measure of spread. In an embodiment, the identifying comprises determining a statistic, fitted curve or fitted function through the metrology data of the at least two different metrology recipes and wherein the variation is between the parameter of the reference for the plurality of different metrology recipes and a parameter of the statistic, fitted curve or fitted function through the metrology data of the at least two different metrology recipes. In an embodiment, the plurality of different metrology recipes for the reference comprises all the different metrology recipes under consideration and for which the metrology data is available. In an embodiment, the reference comprises a slope of a curve through the metrology data and the identifying comprises determining a difference in slope of the reference with the slope of a curve through the collective metrology data of the at least two different metrology recipes and identifying the at least two different metrology recipes responsive to the difference meeting or falling below a certain threshold. In an embodiment, the determining the reference comprises determining the reference for each subset of a plurality of subsets, each subset comprising a different combination of two or more different metrology recipes selected from a larger set of different metrology recipes, and the identifying at least two different metrology recipes comprises selecting at least one of the subsets as the selected at least two different metrology recipes, which has a variation of its collective metrology data from its reference that is less than that of another subset. In an embodiment, the variation is a measure of spread. In an embodiment, the metrology data is specified at a pixel level of a detector of an inspection apparatus used to acquire the metrology data and/or of an image produced by a detector of an inspection apparatus used to acquire the metrology data. In an embodiment, the method further comprises performing a selection of the plurality of different metrology recipes from a larger set of different metrology recipes based on a performance parameter or indicator. In an embodiment, the metrology recipes are different in terms of a wavelength of measurement radiation for the metrology target. In an embodiment, the method further comprises measuring an instance of the metrology target using the at least two different metrology recipes and determining an overlay value from the results of the measuring. In an embodiment, the determining the overlay value comprises determining or correcting an overlay using signal data for the first target structure versus signal data for the second target structure data obtained with the at least two different metrology recipes. In an embodiment, the signal data for the first target structure is asymmetry data for the first target structure and the signal data for the second target structure is asymmetry data for the second target structure. In an embodiment, the asymmetry data for the first target structure is A+ data and the asymmetry data for the second target structure is A− data.

In an embodiment, there is provided a method comprises: obtaining, for a metrology target, overlay values per pixel of a detector of an inspection apparatus used to measure the metrology target and/or of an image produced by a detector of an inspection apparatus used to measure the metrology target using a plurality of different metrology recipes, the metrology target created using a patterning process and each metrology recipe specifying a different parameter of measurement; determining a statistic of the overlay values for each of the plurality of different metrology recipes; and identifying at least two different metrology recipes that have a value of the statistic that crosses or meets a certain threshold.

In an embodiment, the identifying comprises selecting the at least two different metrology recipes that a value of its statistic less than that of a plurality of other combinations of two different metrology recipes. In an embodiment, the statistic comprises a measure of spread. In an embodiment, the overlay values are determined from A+ versus A− data. In an embodiment, the method further comprises measuring an instance of the metrology target using the at least two different metrology recipes and determining an overlay value from the results of the measuring. In an embodiment, the metrology recipes are different in terms of a wavelength of measurement radiation for the metrology target.

While the embodiments disclosed above are described in terms of diffraction based overlay measurements in a field plane (e.g., measurements made using the second measurement branch of the apparatus shown in FIG. 7A), in principle the same methods can be used for pupil based overlay measurements (e.g., measurements made using the first measurement branch of the apparatus shown in FIG. 7A). Consequently, it should be appreciated that the concepts described herein are equally applicable to diffraction based overlay measurements in the field plane and pupil plane.

While embodiments of the metrology target and process parameters described herein have mostly been described in the terms of an overlay target used to measure overlay, embodiments of the metrology target described herein may be used to measure one or more additional or alternative patterning process parameters. For example, the metrology target may be used to measure exposure dose variation, measure exposure focus/defocus, measure edge placement error, measure CD, etc. Further, the description here may also apply, with modifications as appropriate, to, e.g., substrate and/or patterning device alignment in a lithographic apparatus using an alignment mark. Similarly, the appropriate recipe for the alignment measurement may be determined.

So, while a performance parameter of interest is overlay, other parameters (e.g., dose, focus, CD, etc.) of performance of the patterning process can be determined using the methods described herein with, e.g., appropriate modifications to the multiple wavelength equations. The performance parameter (e.g., overlay, CD, focus, dose, etc.) can be fed back (or fed forward) for improvement of the patterning process, improvement of the target, and/or used to improve the modeling, measurement and calculation processes described herein.

While the target structures described above are metrology targets specifically designed and formed for the purposes of measurement, in other embodiments, properties may be measured on targets which are functional parts of devices formed on the substrate. Many devices have regular, periodic structures akin to a grating. The term "target", "grating" or "periodic structure" of a target as used herein does not require that the applicable structure has been provided specifically for the measurement being performed. Further, pitch P of the metrology target is close to the resolution limit of the optical system of the measurement tool, but may be much larger than the dimension of typical product features made by a patterning process in the target portions C. In practice the features and/or spaces of the periodic structures may be made to include smaller structures similar in dimension to the product features.

In association with the physical structures of the targets as realized on substrates and patterning devices, an embodiment may include a computer program containing one or more sequences of machine-readable instructions and/or functional data describing the target design, describing a method of designing a target for a substrate and/or metrology recipe, describing a method of producing a target on a substrate, describing a method of measuring a target on a substrate and/or describing a method of analyzing a measurement to obtain information about a patterning process. This computer program may be executed for example within unit PU in the apparatus of FIG. 7 and/or the control unit LACU of FIG. 2. There may also be provided a data storage medium (e.g., semiconductor memory, magnetic or optical disk) having such a computer program stored therein. Where an existing inspection apparatus, for example of the type shown in FIG. 7, is already in production and/or in use, an embodiment can be implemented by the provision of an updated computer program product for causing a processor to perform one or more of the methods described herein. The program may optionally be arranged to control an optical system, substrate support and the like to perform a method of measuring a parameter of the patterning process on a suitable plurality of targets. The program can update the lithographic and/or metrology recipe for measurement of further substrates. The program may be arranged to control (directly or indirectly) the lithographic apparatus for the patterning and processing of further substrates.

Further, embodiments have been described herein in relation to diffraction-based metrology, which, for example, measures the relative position of overlapping periodic structures from the intensity from the diffracted orders. However, embodiments herein may be applied, with appropriate modification where needed, to image-based metrology, which, for example, measures the relative position from target 1 in layer 1 to target 2 in layer 2 using high-quality images of the targets. Usually these targets are periodic structures or "boxes" (Box-in-Box (BiB)).

The term "optimizing" and "optimization" as used herein refers to or means adjusting an apparatus and/or process of the patterning process, which may include adjusting a lithography process or apparatus, or adjusting the metrology process or apparatus (e.g., the target, measurement tool, etc.), such that a figure of merit has a more desirable value, such as measurement, patterning and/or device fabrication results and/or processes have one or more desirable characteristics, projection of a design layout on a substrate being more accurate, a process window being larger, etc. Thus, optimizing and optimization refers to or means a process that identifies one or more values for one or more design variables that provide an improvement, e.g. a local optimum, in a figure of merit, compared to an initial set of values of the design variables. "Optimum" and other related terms should be construed accordingly. In an embodiment, optimization steps can be applied iteratively to provide further improvements in one or more figures of merit.

An embodiment of the invention may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

One or more aspects disclosed herein may be implemented in a control system. Any control system described herein may each or in combination be operable when the one or more computer programs are read by one or more computer processors located within at least one component of an apparatus. The control systems may each or in combination have any suitable configuration for receiving, processing, and sending signals. One or more processors are configured to communicate with the at least one of the control systems. For example, each control system may include one or more processors for executing the computer programs that include machine-readable instructions for the methods described above. The control systems may include data storage medium for storing such computer programs, and/or hardware to receive such medium. So the control system(s) may operate according the machine readable instructions of one or more computer programs.

Further embodiments according to the invention are further described in below numbered clauses:

1. A method comprising:
for a metrology target, having a first biased target structure and a second differently biased target structure, created using a patterning process, obtaining metrology data comprising signal data for the first target structure versus signal data for the second target structure, the metrology data being obtained for a plurality of different metrology recipes and each metrology recipe specifying a different parameter of measurement;
determining a statistic, fitted curve or fitted function through the metrology data for the plurality of different metrology recipes as a reference; and
identifying at least two different metrology recipes that have a variation of the collective metrology data of the at least two different metrology recipes from a parameter of the reference that crosses or meets a certain threshold.

2. The method of clause 1, comprising determining the fitted curve or function and wherein the curve or function is linear.

3. The method of clause 1 or clause 2, wherein the parameter is a statistical measure of spread.

4. The method of any of clauses 1-3, wherein the identifying comprises determining a statistic, fitted curve or fitted function through the metrology data of the at least two different metrology recipes and wherein the variation is between the parameter of the reference for the plurality of different metrology recipes and a parameter of the statistic, fitted curve or fitted function through the metrology data of the at least two different metrology recipes.

5. The method of any of clauses 1-4, wherein the plurality of different metrology recipes for the reference comprises all the different metrology recipes under consideration and for which the metrology data is available.

6. The method of clause 5, wherein the reference comprises a slope of a curve through the metrology data and the identifying comprises determining a difference in slope of the reference with the slope of a curve through the collective metrology data of the at least two different metrology recipes and identifying the at least two different metrology recipes responsive to the difference meeting or falling below a certain threshold.

7. The method of any of clauses 1-4, wherein the determining the reference comprises determining the reference for each subset of a plurality of subsets, each subset comprising a different combination of two or more different metrology recipes selected from a larger set of different metrology recipes, and the identifying at least two different metrology recipes comprises selecting at least one of the subsets as the selected at least two different metrology recipes, which has a variation of its collective metrology data from its reference that is less than that of another subset.

8. The method of clause 7, wherein the variation is a measure of spread.

9. The method of any of clauses 1-8, wherein the metrology data is specified at a pixel level of a detector of an inspection apparatus used to acquire the metrology data and/or of an image produced by a detector of an inspection apparatus used to acquire the metrology data.

10. The method of any of clauses 1-9, further comprising performing a selection of the plurality of different metrology recipes from a larger set of different metrology recipes based on a performance parameter or indicator.

11. The method of any of clauses 1-10, wherein the metrology recipes are different in terms of a wavelength of measurement radiation for the metrology target.

12. The method of any of clauses 1-11, further comprising measuring an instance of the metrology target using the at least two different metrology recipes and determining an overlay value from the results of the measuring.

13. The method of clause 12, wherein the determining the overlay value comprises determining or correcting an overlay using signal data for the first target structure versus signal data for the second target structure data obtained with the at least two different metrology recipes.

14. The method of any of clauses 1-13, wherein the signal data for the first target structure is asymmetry data for the first target structure and the signal data for the second target structure is asymmetry data for the second target structure.

15. The method of clause 14, wherein the asymmetry data for the first target structure is A+ data and the asymmetry data for the second target structure is A− data.

16. A method comprising:
   obtaining, for a metrology target, overlay values per pixel of a detector of an inspection apparatus used to measure the metrology target and/or of an image produced by a detector of an inspection apparatus used to measure the metrology target using a plurality of different metrology recipes, the metrology target created using a patterning process and each metrology recipe specifying a different parameter of measurement;
   determining a statistic of the overlay values for each of the plurality of different metrology recipes; and
   identifying at least two different metrology recipes that have a value of the statistic that crosses or meets a certain threshold.

17. The method of clause 16, wherein the identifying comprises selecting the at least two different metrology recipes that a value of its statistic less than that of a plurality of other combinations of two different metrology recipes.

18. The method of clause 16 or clause 17, wherein the statistic comprises a measure of spread.

19. The method of any of clauses 16-18, wherein the overlay values are determined from A+ versus A− data.

20. The method of any of clauses 16-19, further comprising measuring an instance of the metrology target using the at least two different metrology recipes and determining an overlay value from the results of the measuring.

21. The method of any of clauses 16-20 wherein the metrology recipes are different in terms of a wavelength of measurement radiation for the metrology target.

22. A metrology apparatus for measuring a parameter of a patterning process, the metrology apparatus being operable to perform the method of any of clauses 1 to 21.

23. A non-transitory computer program product comprising machine-readable instructions for causing a processor to cause performance of the method of any of clauses 1-21.

24. A system comprising:
   an inspection apparatus configured to provide a beam of radiation on a metrology target on a substrate and to detect radiation diffracted by the target; and
   the non-transitory computer program product of clause 23.

25. The system of clause 24, further comprising a lithographic apparatus comprising a support structure configured to hold a patterning device to modulate a radiation beam and a projection optical system arranged to project the modulated radiation beam onto a radiation-sensitive substrate.

Although specific reference may have been made above to the use of embodiments in the context of optical lithography, it will be appreciated that embodiments of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultrA-violet (EUV) radiation (e.g., having a wavelength in the range of 5-20 nm), as well as particle beams, such as ion beams or electron beams. In an embodiment, the measurement radiation is selected from the range of 400 nm to 950 nm.

The term "lens", where the context allows, may refer to any one or combination of various types of optical components, including refractive, reflective, magnetic, electromagnetic and electrostatic optical components.

The foregoing description of the specific embodiments reveals the general nature of embodiments of the invention such that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
   for a metrology target, having a first biased target structure and a second differently biased target structure, created using a patterning process, obtaining metrology data comprising signal data for the first target structure versus signal data for the second target structure, the metrology data being obtained for a plurality of different metrology recipes and each metrology recipe specifying a different parameter of measurement;
   determining a statistic, fitted curve or fitted function through the metrology data for the plurality of different metrology recipes as a reference; and
   identifying at least two different metrology recipes that have a variation of the collective metrology data of the at least two different metrology recipes from a parameter of the reference that crosses or meets a certain threshold.

2. The method of claim 1, comprising determining the fitted curve or function and wherein the curve or function is linear.

3. The method of claim 1, wherein the parameter is a statistical measure of spread.

4. The method of claim 1, wherein the identifying comprises determining a statistic, fitted curve or fitted function through the metrology data of the at least two different metrology recipes and wherein the variation is between the parameter of the reference for the plurality of different metrology recipes and a parameter of the statistic, fitted curve or fitted function through the metrology data of the at least two different metrology recipes.

5. The method of claim 1, wherein the plurality of different metrology recipes for the reference comprises all the different metrology recipes under consideration and for which the metrology data is available.

6. The method of claim 5, wherein the reference comprises a slope of a curve through the metrology data and the identifying comprises determining a difference in slope of the reference with the slope of a curve through the collective metrology data of the at least two different metrology recipes and identifying the at least two different metrology recipes responsive to the difference meeting or falling below a certain threshold.

7. The method of claim 1, wherein the determining the reference comprises determining the reference for each subset of a plurality of subsets, each subset comprising a different combination of two or more different metrology recipes selected from a larger set of different metrology recipes, and the identifying at least two different metrology recipes comprises selecting at least one of the subsets as the selected at least two different metrology recipes, which selected at least one subset has a variation of its collective metrology data from its reference that is less than that of another subset.

8. The method of claim 7, wherein the variation is a measure of spread.

9. The method of claim 1, wherein the metrology data is specified at a pixel level of a detector of an inspection apparatus used to acquire the metrology data and/or of an image produced by a detector of an inspection apparatus used to acquire the metrology data.

10. The method of claim 1, further comprising performing a selection of the plurality of different metrology recipes from a larger set of different metrology recipes based on a performance parameter or indicator.

11. The method of claim 1, wherein the metrology recipes are different in terms of a wavelength of measurement radiation for the metrology target.

12. The method of claim 1, further comprising measuring an instance of the metrology target using the at least two different metrology recipes and determining an overlay value from the results of the measuring.

13. The method of claim 12, wherein the determining the overlay value comprises determining or correcting an overlay using signal data for the first target structure versus signal data for the second target structure data obtained with the at least two different metrology recipes.

14. The method of claim 1, wherein the signal data for the first target structure is asymmetry data for the first target structure and the signal data for the second target structure is asymmetry data for the second target structure.

15. The method of claim 14, wherein the asymmetry data for the first target structure is A+ data and the asymmetry data for the second target structure is A− data.

16. A metrology apparatus for measuring a parameter of a patterning process, the metrology apparatus having a processing system comprising instructions, that when executed, are configured to perform the method of claim 1.

17. A method comprising:
obtaining, for a metrology target, overlay values per pixel of a detector of an inspection apparatus used to measure the metrology target and/or of an image produced by a detector of an inspection apparatus used to measure the metrology target using a plurality of different metrology recipes, the metrology target created using a patterning process and each metrology recipe specifying a different parameter of measurement;
determining a statistic of the overlay values for each of the plurality of different metrology recipes; and
identifying at least two different metrology recipes that have a value of the statistic that crosses or meets a certain threshold.

18. The method of claim 17, wherein the identifying comprises selecting the at least two different metrology recipes that has a value of its statistic less than that of a plurality of other combinations of two different metrology recipes.

19. The method of claim 17, wherein the statistic comprises a measure of spread.

20. The method of claim 17, wherein the overlay values are determined from A+ versus A− data.

21. The method of claim 17, further comprising measuring an instance of the metrology target using the at least two different metrology recipes and determining an overlay value from the results of the measuring.

22. The method of claim 17, wherein the metrology recipes are different in terms of a wavelength of measurement radiation for the metrology target.

23. A non-transitory computer program product comprising machine-readable instructions, when executed, configured to cause a processor system to at least:
for a metrology target, having a first biased target structure and a second differently biased target structure, created using a patterning process, obtain metrology data comprising signal data for the first target structure versus signal data for the second target structure, the metrology data being obtained for a plurality of different metrology recipes and each metrology recipe specifying a different parameter of measurement;
determine a statistic, fitted curve or fitted function through the metrology data for the plurality of different metrology recipes as a reference; and
identify at least two different metrology recipes that have a variation of the collective metrology data of the at least two different metrology recipes from a parameter of the reference that crosses or meets a certain threshold.

24. A system comprising:
an inspection apparatus configured to provide a beam of radiation on a metrology target on a substrate and to detect radiation diffracted by the target; and
the non-transitory computer program product of claim 23.

25. The system of claim 24, further comprising a lithographic apparatus comprising a support structure configured to hold a patterning device to modulate a radiation beam and a projection optical system arranged to project the modulated radiation beam onto a radiation-sensitive substrate.

* * * * *